US009046775B2

(12) United States Patent
Minegishi et al.

(10) Patent No.: US 9,046,775 B2
(45) Date of Patent: Jun. 2, 2015

(54) COMPOSITION FOR FORMING LIQUID IMMERSION UPPER LAYER FILM, RESIST PATTERN-FORMING METHOD, POLYMER, AND COMPOUND

(71) Applicant: JSR CORPORATION, Tokyo (JP)

(72) Inventors: Shinya Minegishi, Tokyo (JP); Kiyoshi Tanaka, Tokyo (JP); Kazunori Kusabiraki, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 14/032,528

(22) Filed: Sep. 20, 2013

(65) Prior Publication Data

US 2014/0093826 A1 Apr. 3, 2014
US 2014/0377707 A9 Dec. 25, 2014

(30) Foreign Application Priority Data

Sep. 28, 2012 (JP) ................................. 2012-218885

(51) Int. Cl.
*G03F 7/11* (2006.01)
*G03F 7/20* (2006.01)
*C08F 214/18* (2006.01)

(52) U.S. Cl.
CPC ................ *G03F 7/11* (2013.01); *G03F 7/2041* (2013.01); *C08F 214/18* (2013.01); *C08F 214/182* (2013.01); *C08F 214/186* (2013.01)

(58) Field of Classification Search
None
See application file for complete search history.

(56) References Cited

U.S. PATENT DOCUMENTS 3,658,878 A * 4/1972 Smith ........................... 558/442
4,910,122 A 3/1990 Arnold et al.

FOREIGN PATENT DOCUMENTS

JP 06-12452 B2 5/1984
JP 2004-53822 * 2/2004
JP 2006-091798 4/2006
WO WO 2008/047678 4/2008
WO WO 2009/041270 4/2009

OTHER PUBLICATIONS

Derwent English abstract for JP 2004-53822 (2004).*

* cited by examiner

*Primary Examiner* — Sin Lee
(74) *Attorney, Agent, or Firm* — Oblon, McClelland, Maier & Neustadt, L.L.P.

(57) ABSTRACT

A composition for forming a liquid immersion upper layer film includes a polymer component including a polymer having a structural unit represented by a formula (1); and a solvent. $R^1$ represents a carboxy group or a group represented by a formula (2); X represents a single bond, a divalent hydrocarbon group having 1 to 20 carbon atoms or a divalent fluorinated hydrocarbon group having 1 to 20 carbon atoms; $R^2$ represents a hydrocarbon group having 1 to 20 carbon atoms and a valency of (n+1), a fluorinated hydrocarbon group having 1 to 20 carbon atoms and a valency of (n+1), or one of these groups each including between adjacent two carbon atoms thereof —CO—, —COO—, —O—, —NR'—, —CS—, —S—, —SO—, $—SO_2—$ or a combination thereof; and $R^3$ represents a hydrogen atom or a monovalent organic group having 1 to 20 carbon atoms.

(1)

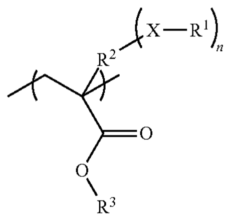

(2)

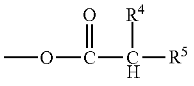

10 Claims, No Drawings

COMPOSITION FOR FORMING LIQUID IMMERSION UPPER LAYER FILM, RESIST PATTERN-FORMING METHOD, POLYMER, AND COMPOUND

CROSS-REFERENCE TO RELATED APPLICATIONS

The present application claims priority under 35 U.S.C. §119 to Japanese Patent Application No. 2012-218885, filed Sep. 28, 2012. The contents of this application are incorporated herein by reference in their entirety.

BACKGROUND OF THE INVENTION

1. Field of the Invention

The present invention relates to a composition for forming a liquid immersion upper layer film, a resist pattern-forming method, a polymer and a compound.

2. Discussion of the Background

In the field of microfabrication typified by production of integrated circuit elements, chemically amplified resists have been conventionally used. In chemically amplified resists, irradiation with, for example, a radioactive ray having a short wavelength such as an excimer laser beam generates an acid at light-exposed sites to cause a difference in rates of dissolution in an alkaline developer solution between light-exposed sites and light-unexposed sites by a reaction by way of the acid as a catalyst, thereby forming a resist pattern on a substrate.

In such chemically amplified resists, as a method for forming a finer resist pattern, the utilization of a liquid immersion lithography process (liquid immersion lithography) is expanding in which exposure is conducted while allowing a liquid immersion media such as, for example, pure water or a fluorine-based inert liquid to be filled in a space between a lens and a resist film. The liquid immersion lithography process allows for an increase in numerical aperture (NA) of the lens, and further provides advantages that, even when the NA is increased, depth of focus is hardly decreased and additionally high resolution can be achieved, and the like.

On the other hand, in the resist pattern formation by the liquid immersion lithography process, it is required to improve its scan speed, while inhibiting pattern defects attributed to elution of a component of the resist film and/or droplets remaining on the surface of the resist film. As a technique for satisfying the requirements, it is proposed to provide a liquid immersion upper layer film between the resist film and a liquid immersion medium (see, Japanese Unexamined Patent Application, Publication No. 2006-91798; PCT International Publication No. 2008/47678; and PCT International Publication No. 2009/41270). These Patent Documents disclose that: the liquid immersion upper layer film is provided on the resist film using a water-insoluble and alkali-soluble polymer; during the liquid immersion lithography, inhibition of the elution of the resist film component and the like is achieved based on the water repellency possessed by the liquid immersion upper layer film; a high scan speed is realized based on a high receding contact angle of the surface of the resist film; and additionally, in a subsequent step of development with an alkali, the liquid immersion upper layer film is peeled from the surface of the resist film by dissolving the liquid immersion upper layer film in a developer solution.

In addition to being excellent in the elution inhibitory property and the performance based on high water repellency such as the high receding contact angle as described above, it is required for the liquid immersion upper layer film to have superior adhesiveness to a peripheral part of a substrate, and to be excellent in peel resistance. Furthermore, for improvement of the process stability, further improvement of the peel resistance is also required.

SUMMARY OF THE INVENTION

According to one aspect of the present invention, a composition for forming a liquid immersion upper layer film includes a polymer component including a first polymer having a first structural unit represented by a formula (1); and a solvent.

(1)

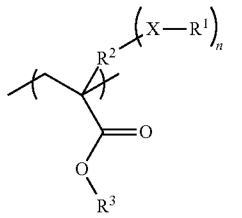

In the formula (1), $R^1$ represents a carboxy group or a group represented by a formula (2). X represents a single bond, a divalent hydrocarbon group having 1 to 20 carbon atoms or a divalent fluorinated hydrocarbon group having 1 to 20 carbon atoms. $R^2$ represents a hydrocarbon group having 1 to 20 carbon atoms and having a valency of (n+1), a fluorinated hydrocarbon group having 1 to 20 carbon atoms and having a valency of (n+1), a hydrocarbon group having 1 to 20 carbon atoms and having a valency of (n+1) that includes between adjacent two carbon atoms thereof —CO—, —COO—, —O—, —NR'—, —CS—, —S—, —SO—, $—SO_2—$ or a combination thereof, or a fluorinated hydrocarbon group having 1 to 20 carbon atoms and having a valency of (n+1) that includes between adjacent two carbon atoms thereof —CO—, —COO—, —O—, —NR'—, —CS—, —S—, —SO—, $—SO_2—$ or a combination thereof; R' represents a monovalent hydrocarbon group having 1 to 10 carbon atoms; n is an integer of 1 to 4. $R^3$ represents a hydrogen atom or a monovalent organic group having 1 to 20 carbon atoms.

(2)

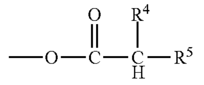

In the formula (2), $R^4$ represents a hydrogen atom, a halogen atom, a nitro group, an alkyl group, a monovalent alicyclic hydrocarbon group, an alkoxy group, an acyl group, an aralkyl group or an aryl group, wherein a part or all of hydrogen atoms included in the alkyl group, the alicyclic hydrocarbon group, the alkoxy group, the acyl group, the aralkyl group and the aryl group represented by $R^4$ are not substituted or substituted. $R^5$ represents $—C(C{=}O)—R^6$, $—S({=}O)_2—R^7$, $—R^8—CN$ or $—R^9—NO_2$. $R^6$ and $R^7$ each independently represent a hydrogen atom, an alkyl group, a fluorinated alkyl group, a monovalent alicyclic hydrocarbon group, an alkoxy group, a cyano group, a cyanomethyl group, an aralkyl group or an aryl group, or $R^4$ and one of $R^6$ and $R^7$ taken together represent a ring structure, and a rest of $R^6$ and $R^7$ represents a hydrogen atom, an alkyl group, a fluorinated alkyl group, a monovalent alicyclic hydrocarbon group, an alkoxy group, a cyano group, a cyanomethyl group, an aralkyl group or an aryl group. $R^8$ and $R^9$ each independently represent a single bond, a methylene group or an alkylene group having 2 to 5 carbon atoms.

According to another aspect of the present invention, a resist pattern-forming method includes providing a resist film using a photoresist composition. A liquid immersion upper layer film is provided on the resist film using the composition. The resist film having the liquid immersion upper layer film provided thereon is exposed to an exposure light through a liquid immersion medium. The resist film is developed.

According to further aspect of the present invention, a polymer includes a first structural unit represented by a formula (1).

(1)

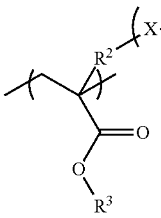

In the formula (1), $R^1$ represents a carboxy group or a group represented by a formula (2). X represents a single bond, a divalent hydrocarbon group having 1 to 20 carbon atoms or a divalent fluorinated hydrocarbon group having 1 to 20 carbon atoms. $R^2$ represents a hydrocarbon group having 1 to 20 carbon atoms and having a valency of (n+1), a fluorinated hydrocarbon group having 1 to 20 carbon atoms and having a valency of (n+1), a hydrocarbon group having 1 to 20 carbon atoms and having a valency of (n+1) that includes between adjacent two carbon atoms thereof —CO—, —COO—, —O—, —NR'—, —CS—, —S—, —SO—, $—SO_2—$ or a combination thereof, or a fluorinated hydrocarbon group having 1 to 20 carbon atoms and having a valency of (n+1) that includes between adjacent two carbon atoms thereof —CO—, —COO—, —O—, —NR'—, —CS—, —S—, —SO—, $—SO_2—$ or a combination thereof; R' represents a monovalent hydrocarbon group having 1 to 10 carbon atoms; and n is an integer of 1 to 4. $R^3$ represents a hydrogen atom or a monovalent organic group having 1 to 20 carbon atoms.

(2)

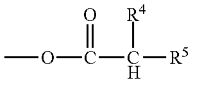

In the formula (2), $R^4$ represents a hydrogen atom, a halogen atom, a nitro group, an alkyl group, a monovalent alicyclic hydrocarbon group, an alkoxy group, an acyl group, an aralkyl group or an aryl group, wherein a part or all of hydrogen atoms included in the alkyl group, the alicyclic hydrocarbon group, the alkoxy group, the acyl group, the aralkyl group and the aryl group represented by $R^4$ are not substituted or substituted. $R^5$ represents $—C(C{=}O)—R^6$, $—S({=}O)_2—R^7$, $—R^8—CN$ or $—R^9—NO_2$. $R^6$ and $R^7$ each independently represent a hydrogen atom, an alkyl group, a fluorinated alkyl group, a monovalent alicyclic hydrocarbon group, an alkoxy group, a cyano group, a cyanomethyl group, an aralkyl group or an aryl group, or $R^4$ and one of $R^6$ and $R^7$ taken together represent a ring structure, and a rest of $R^6$ and $R^7$ represents a hydrogen atom, an alkyl group, a fluorinated alkyl group, a monovalent alicyclic hydrocarbon group, an alkoxy group, a cyano group, a cyanomethyl group, an aralkyl group or an aryl group. $R^8$ and $R^9$ each independently represent a single bond, a methylene group or an alkylene group having 2 to 5 carbon atoms.

According to further aspect of the present invention, a compound is represented by a formula (i).

(i)

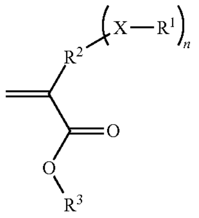

In the formula (i), $R^1$ represents a carboxy group or a group represented by a formula (2). X represents a single bond, a divalent hydrocarbon group having 1 to 20 carbon atoms or a divalent fluorinated hydrocarbon group having 1 to 20 carbon atoms. $R^2$ represents a hydrocarbon group having 1 to 20 carbon atoms and having a valency of (n+1), a fluorinated hydrocarbon group having 1 to 20 carbon atoms and having a valency of (n+1), a hydrocarbon group having 1 to 20 carbon atoms and having a valency of (n+1) that includes between adjacent two carbon atoms thereof —CO—, —COO—, —O—, —NR'—, —CS—, —S—, —SO—, $—SO_2—$ or a combination thereof, or a fluorinated hydrocarbon group having 1 to 20 carbon atoms and having a valency of (n+1) that includes between adjacent two carbon atoms thereof —CO—, —COO—, —O—, —NR'—, —CS—, —S—, —SO—, $—SO_2—$ or a combination thereof; R' represents a monovalent hydrocarbon group having 1 to 10 carbon atoms; and n is an integer of 1 to 4. $R^3$ represents a hydrogen atom or a monovalent organic group having 1 to 20 carbon atoms.

(2)

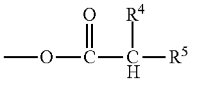

In the formula (2), $R^4$ represents a hydrogen atom, a halogen atom, a nitro group, an alkyl group, a monovalent alicyclic hydrocarbon group, an alkoxy group, an acyl group, an aralkyl group or an aryl group, wherein a part or all of hydrogen atoms included in the alkyl group, the alicyclic hydrocarbon group, the alkoxy group, the acyl group, the aralkyl group and the aryl group represented by $R^4$ are not substituted or substituted. $R^5$ represents $—C({=}O)—R^6$, $—S({=}O)_2—R^7$, $—R^8—CN$ or $—R^9—NO_2$. $R^6$ and $R^7$ each independently represent a hydrogen atom, an alkyl group, a fluorinated alkyl group, a monovalent alicyclic hydrocarbon group, an alkoxy group, a cyano group, a cyanomethyl group, an aralkyl group or an aryl group, or $R^4$ and one of $R^6$ and $R^7$ taken together represent a ring structure, and a rest of $R^6$ and $R^7$ represents a hydrogen atom, an alkyl group, a fluorinated alkyl group, a monovalent alicyclic hydrocarbon group, an alkoxy group, a cyano group, a cyanomethyl group, an aralkyl group or an aryl group. $R^8$ and $R^9$ each independently represent a single bond, a methylene group or an alkylene group having 2 to 5 carbon atoms.

DESCRIPTION OF THE EMBODIMENTS

The ordinal numbers in the terms "first polymer", "second polymer", "third polymer", "first structural unit", "second structural unit", or the like recited in the claims and SUMMARY OF THE INVENTION and ABSTRACT of the specification of the present application are merely identifiers, but does not have any other meanings, for example, a particular order and the like. Moreover, for example, the term "third polymer" itself does not imply an existence of the "second polymer" and "third structural unit" itself does not imply an existence of the "second structural unit."

An embodiment of the present invention which was made for solving the foregoing problem relates to a composition for forming a liquid immersion upper layer film, including:

(A) a polymer component including a polymer (a) having a structural unit (I) represented by the following formula (1) (hereinafter, may be also referred to as "(A) polymer component"); and (B) a solvent, (1)

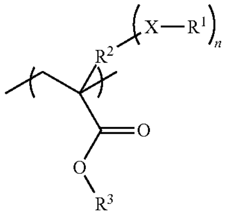

wherein, in the formula (1), $R^1$ represents a carboxy group or a group represented by the following formula (2);

X represents a single bond, a divalent hydrocarbon group having 1 to 20 carbon atoms or a divalent fluorinated hydrocarbon group having 1 to 20 carbon atoms;

$R^2$ represents a hydrocarbon group having 1 to 20 carbon atoms and having a valency of (n+1), a fluorinated hydrocarbon group having 1 to 20 carbon atoms and having a valency of (n+1), a hydrocarbon group having 1 to 20 carbon atoms and having a valency of (n+1) that includes between adjacent two carbon atoms thereof —CO—, —COO—, —O—, —NR'—, —CS—, —S—, —SO—, $—SO_2—$ or a combination thereof, or a fluorinated hydrocarbon group having 1 to 20 carbon atoms and having a valency of (n+1) that includes between adjacent two carbon atoms thereof —CO—, —COO—, —O—, —NR'—, —CS—, —S—, —SO—, $—SO_2—$ or a combination thereof; R' represents a monovalent hydrocarbon group having 1 to 10 carbon atoms; and n is an integer of 1 to 4; and $R^3$ represents a hydrogen atom or a monovalent organic group having 1 to 20 carbon atoms, and (2)

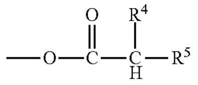

wherein, in the formula (2), $R^4$ represents a hydrogen atom, a halogen atom, a nitro group, an alkyl group, a monovalent alicyclic hydrocarbon group, an alkoxy group, an acyl group, an aralkyl group or an aryl group, wherein a part or all of hydrogen atoms included in the alkyl group, the alicyclic hydrocarbon group, the alkoxy group, the acyl group, the aralkyl group and the aryl group represented by $R^4$ are not substituted or substituted; $R^5$ represents —C(═O)—$R^6$, $—S(═O)_2—R^7$, —$R^8$—CN or —$R^9$—$NO_2$; $R^6$ and $R^7$ each independently represent a hydrogen atom, an alkyl group, a fluorinated alkyl group, a monovalent alicyclic hydrocarbon group, an alkoxy group, a cyano group, a cyanomethyl group, an aralkyl group or an aryl group, or $R^4$ and one of $R^6$ and $R^7$ taken together represent a ring structure, and the rest of $R^6$ and $R^7$ represents a hydrogen atom, an alkyl group, a fluorinated alkyl group, a monovalent alicyclic hydrocarbon group, an alkoxy group, a cyano group, a cyanomethyl group, an aralkyl group or an aryl group; and $R^8$ and $R^9$ each independently represent a single bond, a methylene group or an alkylene group having 2 to 5 carbon atoms.

A resist pattern-forming method according to an embodiment of the present invention includes:

(1) providing a resist film using a photoresist composition;

(2) providing a liquid immersion upper layer film on the resist film using the composition for forming a liquid immersion upper layer film according to the embodiment of the present invention;

(3) exposing the resist film having the liquid immersion upper layer film provided thereon to an exposure light through a liquid immersion medium; and (4) developing the resist film.

A polymer according to an embodiment of the present invention has a structural unit (I) represented by the following formula (1):

(1)

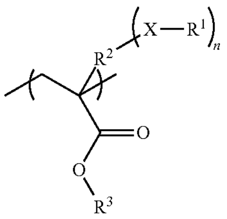

wherein, in the formula (1), $R^1$ represents a carboxy group or a group represented by the following formula (2);

X represents a single bond, a divalent hydrocarbon group having 1 to 20 carbon atoms or a divalent fluorinated hydrocarbon group having 1 to 20 carbon atoms;

$R^2$ represents a hydrocarbon group having 1 to 20 carbon atoms and having a valency of (n+1), a fluorinated hydrocarbon group having 1 to 20 carbon atoms and having a valency of (n+1), a hydrocarbon group having 1 to 20 carbon atoms and having a valency of (n+1) that includes between adjacent two carbon atoms thereof —CO—, —COO—, —O—, —NR'—, —CS—, —S—, —SO—, $—SO_2—$ or a combination thereof, or a fluorinated hydrocarbon group having 1 to 20 carbon atoms and having a valency of (n+1) that includes between adjacent two carbon atoms thereof —CO—, —COO—, —O—, —NR'—, —CS—, —S—, —SO—, $—SO_2—$ or a combination thereof; R' represents a monovalent hydrocarbon group having 1 to 10 carbon atoms; and n is an integer of 1 to 4;

$R^3$ represents a hydrogen atom or a monovalent organic group having 1 to 20 carbon atoms, and (2)

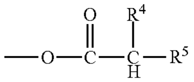

wherein, in the formula (2), $R^4$ represents a hydrogen atom, a halogen atom, a nitro group, an alkyl group, a monovalent alicyclic hydrocarbon group, an alkoxy group, an acyl group, an aralkyl group or an aryl group, wherein a part or all of hydrogen atoms included in the alkyl group, the alicyclic hydrocarbon group, the alkoxy group, the acyl group, the aralkyl group and the aryl group represented by $R^4$ are not substituted or substituted; $R^5$ represents —C(=O)—$R^6$, —S(=O)$_2$—$R^7$, —$R^8$—CN or —$R^9$—$NO_2$; $R^6$ and $R^7$ each independently represent a hydrogen atom, an alkyl group, a fluorinated alkyl group, a monovalent alicyclic hydrocarbon group, an alkoxy group, a cyano group, a cyanomethyl group, an aralkyl group or an aryl group, or $R^4$ and one of $R^6$ and $R^7$ taken together represent a ring structure, and the rest of $R^6$ and $R^7$ represents a hydrogen atom, an alkyl group, a fluorinated alkyl group, a monovalent alicyclic hydrocarbon group, an alkoxy group, a cyano group, a cyanomethyl group, an aralkyl group or an aryl group; and $R^8$ and $R^9$ each independently represent a single bond, a methylene group or an alkylene group having 2 to 5 carbon atoms.

A compound according to an embodiment of the present invention (hereinafter, may be also referred to as "compound (i)") is represented by the following formula (i):

(i)

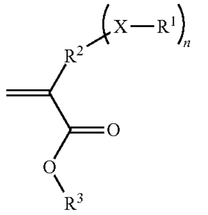

wherein, in the formula (i), $R^1$ represents a carboxy group or a group represented by the following formula (2);

X represents a single bond, a divalent hydrocarbon group having 1 to 20 carbon atoms or a divalent fluorinated hydrocarbon group having 1 to 20 carbon atoms;

$R^2$ represents a hydrocarbon group having 1 to 20 carbon atoms and having a valency of (n+1), a fluorinated hydrocarbon group having 1 to 20 carbon atoms and having a valency of (n+1), a hydrocarbon group having 1 to 20 carbon atoms and having a valency of (n+1) that includes between adjacent two carbon atoms thereof —CO—, —COO—, —O—, —NR'—, —CS—, —S—, —SO—, —$SO_2$— or a combination thereof, or a fluorinated hydrocarbon group having 1 to 20 carbon atoms and having a valency of (n+1) that includes between adjacent two carbon atoms thereof —CO—, —COO—, —O—, —NR'—, —CS—, —S—, —SO—, —$SO_2$— or a combination thereof; R' represents a monovalent hydrocarbon group having 1 to 10 carbon atoms; and n is an integer of 1 to 4; and $R^3$ represents a hydrogen atom or a monovalent organic group having 1 to 20 carbon atoms, and (2)

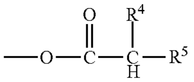

wherein, in the formula (2), $R^4$ represents a hydrogen atom, a halogen atom, a nitro group, an alkyl group, a monovalent alicyclic hydrocarbon group, an alkoxy group, an acyl group, an aralkyl group or an aryl group, wherein a part or all of hydrogen atoms included in the alkyl group, the alicyclic hydrocarbon group, the alkoxy group, the acyl group, the aralkyl group and the aryl group represented by $R^4$ are not substituted or substituted; $R^5$ represents —C(=O)—$R^6$, —S(=O)$_2$—$R^7$, —$R^8$—CN or —$R^9$—$NO_2$; $R^6$ and $R^7$ each independently represent a hydrogen atom, an alkyl group, a fluorinated alkyl group, a monovalent alicyclic hydrocarbon group, an alkoxy group, a cyano group, a cyanomethyl group, an aralkyl group or an aryl group, or $R^4$ and one of $R^6$ and $R^7$ taken together represent a ring structure, and the rest of $R^6$ and $R^7$ represents a hydrogen atom, an alkyl group, a fluorinated alkyl group, a monovalent alicyclic hydrocarbon group, an alkoxy group, a cyano group, a cyanomethyl group, an aralkyl group or an aryl group; and $R^8$ and $R^9$ each independently represent a single bond, a methylene group or an alkylene group having 2 to 5 carbon atoms.

As used herein, the term "hydrocarbon group" includes a chain hydrocarbon group, an alicyclic hydrocarbon group and an aromatic hydrocarbon group. The "hydrocarbon group" may be a saturated hydrocarbon group or an unsaturated hydrocarbon group. The term "chain hydrocarbon group" refers to a hydrocarbon group that is constituted with only a chain structure without including a cyclic structure, and the term "chain hydrocarbon group" includes both a linear hydrocarbon group and a branched hydrocarbon group. The term "alicyclic hydrocarbon group" refers to a hydrocarbon group that includes as a ring structure not an aromatic ring structure but only an alicyclic structure, and the term "alicyclic hydrocarbon group" includes both a monocyclic alicyclic hydrocarbon group and a polycyclic alicyclic hydrocarbon group. However, it is not necessary to be constituted with only an alicyclic structure, and a part thereof may include a chain structure. The term "aromatic hydrocarbon group" refers to a hydrocarbon group that includes an aromatic ring structure as a ring structure. However, it is not necessary to be constituted with only an aromatic ring structure, and a part thereof may include a chain structure or an alicyclic structure.

The term "organic group" refers to a group that includes at least one carbon atom.

As explained above, the composition for forming a liquid immersion upper layer film and the resist pattern-forming method according to the embodiments of the present invention can provide a liquid immersion upper layer film which is excellent in peel resistance while exhibiting high water repellency. The polymer according to the embodiment of the present invention can be suitably used as a polymer component of the composition for forming a liquid immersion upper layer film. The compound according to the embodiment of the present invention can be used as a monomer which gives the polymer component. Therefore, these can be suitably used in a liquid immersion lithography process allowing the formation of a finer pattern. The embodiments will now be described in detail.

Composition for Forming a Liquid Immersion Upper Layer Film

The composition for forming a liquid immersion upper layer film according to an embodiment of the present invention includes (A) a polymer component and (B) a solvent. The composition for forming a liquid immersion upper layer film may also include an optional component within a range not leading to impairment of the effects of embodiment of the present invention. Hereinafter, each component will be explained.

(A) Polymer Component

The polymer component (A) includes a polymer (a) having a structural unit (I). The polymer component (A) may be constituted with only the polymer (a), or may include, in addition to the polymer (a), a polymer (b) that does not have the structural unit (I). The polymer component (A) may include one, or two or more types of the polymers.

The polymer (a) may have, in addition to the structural unit (I), a structural unit (II) that includes a sulfo group; a structural unit (III) that includes a fluorinated alkyl group or a fluorinated cycloalkyl group; a structural unit (IV) that is a structural unit other than the structural unit (III) and includes a group represented by the following formula (5), a group represented by the following formula (6) or a combination thereof; a structural unit (V) having a structural unit represented by the following formula (7), a structural unit represented by the following formula (8) or a combination thereof; and the like.

The polymer (b) may have, for example, the structural units (II) to (V), and the like.

The polymer (a) and the polymer (b) each may have one, or two or more types of these structural units.

Hereinafter, each structural unit will be explained.

Structural Unit (I)

The structural unit (I) is a structural unit represented by the following formula (1). The polymer component (A) has the structural unit (I), which includes, in addition to a —$COOR^3$ group, a group represented by the following formula (2) that includes a carboxy group or an active methylene group (hereinafter, may be also referred to as "group (2)") (hereinafter, these groups may be also collectively referred to as "specific group (A)") at the position away from the polymer chain through $R^2$ and X. It is presumed that since the polymer component (A) includes the specific group (A), which contributes to adhesiveness to a substrate, at the position specified above, the adhesiveness is exerted more effectively. The composition for forming a liquid immersion upper layer film can thereby provide a liquid immersion upper layer film which is excellent in peel resistance while exhibiting high water repellency.

(1)

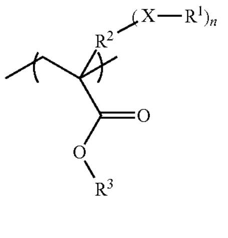

In the above formula (1), $R^1$ represents a carboxy group or a group represented by the following formula (2);

X represents a single bond, a divalent hydrocarbon group having 1 to 20 carbon atoms or a divalent fluorinated hydrocarbon group having 1 to 20 carbon atoms;

$R^2$ represents a hydrocarbon group having 1 to 20 carbon atoms and having a valency of (n+1), a fluorinated hydrocarbon group having 1 to 20 carbon atoms and having a valency of (n+1), a hydrocarbon group having 1 to 20 carbon atoms and having a valency of (n+1) that includes between adjacent two carbon atoms thereof —CO—, —COO—, —O—, —NR'—, —CS—, —S—, —SO—, —$SO_2$— or a combination thereof or a fluorinated hydrocarbon group having 1 to 20 carbon atoms and having a valency of (n+1) that includes between adjacent two carbon atoms thereof —CO—, —COO—, —O—, —NR'—, —CS—, —S—, —SO—, —$SO_2$— or a combination thereof; R' represents a monovalent hydrocarbon group having 1 to 10 carbon atoms; and n is an integer of 1 to 4; and $R^3$ represents a hydrogen atom or a monovalent organic group having 1 to 20 carbon atoms, and (2)

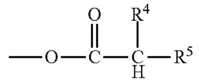

in the formula (2), $R^4$ represents a hydrogen atom, a halogen atom, a nitro group, an alkyl group, a monovalent alicyclic hydrocarbon group, an alkoxy group, an acyl group, an aralkyl group or an aryl group, wherein a part or all of hydrogen atoms included in the alkyl group, the alicyclic hydrocarbon group, the alkoxy group, the acyl group, the aralkyl group and the aryl group represented by $R^4$ are not substituted or substituted; $R^5$ represents —C(C═O)—$R^6$, —S(═O)$_2$—$R^7$, —$R^8$—CN or —$R^9$—$NO_2$; $R^6$ and $R^7$ each independently represent a hydrogen atom, an alkyl group, a fluorinated alkyl group, a monovalent alicyclic hydrocarbon group, an alkoxy group, a cyano group, a cyanomethyl group, an aralkyl group or an aryl group, or $R^4$ and one of $R^6$ and $R^7$ taken together represent a ring structure, and the rest of $R^6$ and $R^7$ represents a hydrogen atom, an alkyl group, a fluorinated alkyl group, a monovalent alicyclic hydrocarbon group, an alkoxy group, a cyano group, a cyanomethyl group, an aralkyl group or an aryl group; and $R^8$ and $R^9$ each independently represent a single bond, a methylene group or an alkylene group having 2 to 5 carbon atoms.

Examples of the divalent hydrocarbon group having 1 to 20 carbon atoms represented by X include a divalent chain hydrocarbon group having 1 to 20 carbon atoms, a divalent alicyclic hydrocarbon group having 3 to 20 carbon atoms, a divalent aromatic hydrocarbon group having 6 to 20 carbon atoms, and the like.

Examples of the divalent chain hydrocarbon group include:

an alkanediyl group such as a methanediyl group, an ethanediyl group, and a propanediyl group;

an alkenediyl group such as an ethenediyl group, a propenediyl group, and a butenediyl group;

an alkynediyl group such as an ethynediyl group, a propynediyl group, and a butynediyl group, and the like.

Examples of the divalent alicyclic hydrocarbon group include:

a monocyclic cycloalkanediyl group such as a cyclopentanediyl group, a cyclohexanediyl group, and a cyclooctanediyl group;

a monocyclic cycloalkenediyl group such as a cyclopentenediyl group, a cyclohexenediyl group, and a cyclooctenediyl group;

a polycyclic cycloalkanediyl group such as a norbornanediyl group and an adamantanediyl group;

a polycyclic cycloalkenediyl group such as a norbornenediyl group and a tricyclodecenyl group, and the like.

Examples of the divalent aromatic hydrocarbon group include:

an aryl group such as a phenyl group, a tolyl group, a xylyl group, a naphthyl group, and an anthryl group;

an aralkyl group such as a benzyl group, a phenethyl group, and a naphthylmethyl group, and the like.

Examples of the divalent fluorinated hydrocarbon group having 1 to 20 carbon atoms represented by X include a divalent fluorinated chain hydrocarbon group having 1 to 20 carbon atoms, a divalent fluorinated alicyclic hydrocarbon group having 3 to 20 carbon atoms, a divalent fluorinated aromatic hydrocarbon group having 6 to 20 carbon atoms, and the like.

Examples of the divalent fluorinated chain hydrocarbon group include:

a fluorinated alkanediyl group such as a fluoromethanediyl group, a difluoromethanediyl group, and a difluoroethanediyl group;

a fluorinated alkenediyl group such as a fluoroethenediyl group and a difluoroethenediyl group;

a fluorinated alkynediyl group such as a fluoropropynediyl group and a difluoropropynediyl group, and the like.

Examples of the divalent fluorinated alicyclic hydrocarbon group include:

a monocyclic fluorinated cycloalkanediyl group such as a fluorocyclopentanediyl group, a difluorocyclopentanediyl group, a fluorocyclohexanediyl group, and a difluorocyclohexanediyl group;

a monocyclic fluorinated cycloalkenediyl group such as a fluorocyclopentenediyl group;

a polycyclic fluorinated cycloalkanediyl group such as a fluoronorbornanediyl group and a fluoroadamantanediyl group;

a polycyclic fluorinated cycloalkenediyl group such as a fluoronorbornenediyl group, and the like.

Examples of the divalent fluorinated aromatic hydrocarbon group include:

a fluorinated arenediyl group such as a fluorobenzenediyl group, a difluorobenzenediyl group, and a fluoronaphthalenediyl group;

a fluorinated alkanediylarenediyl group such as a fluoromethanediylbenzenediyl group, and the like.

X is preferably a single bond, an alkanediyl group, a cycloalkanediyl group, a fluorinated alkanediyl group or a fluorinated cycloalkanediyl group, more preferably a single bond, an alkanediyl group or a fluorinated alkanediyl group, and still more preferably a single bond.

Examples of the hydrocarbon group having 1 to 20 carbon atoms and having a valency of (n+1) and the fluorinated hydrocarbon group having 1 to 20 carbon atoms and having a valency of (n+1) represented by $R^2$ include a group derived from the divalent hydrocarbon group and divalent fluorinated hydrocarbon group exemplified as X by removing (n−1) hydrogen atoms therefrom, and the like.

Examples of the hydrocarbon group having 1 to 20 carbon atoms and having a valency of (n+1) that includes —CO—, —COO—, —O—, —NR'—, —CS—, —S—, —SO—, —$SO_2$— or the combination thereof between adjacent two carbon atoms thereof, or a fluorinated hydrocarbon group having 1 to 20 carbon atoms and having a valency of (n+1) that includes between adjacent two carbon atoms thereof —CO—, —COO—, —O—, —NR'—, —CS—, —S—, —SO—, —$SO_2$— or a combination thereof, which is represented by $R^2$, include as a divalent group (i.e., n=1), —$R^i$—$Z^1$—$R^j$—, —$R^i$—$Z^1$—$R^j$—$Z^2$—$R^k$—, and the like, wherein $R^i$, $R^j$ and $R^k$ each independently represent a divalent hydrocarbon group; and $Z^1$ and $Z^2$ each independently represent —CO—, —COO—, —O—, —NR'—, —CS—, —S—, —SO— or —$SO_2$—.

Examples of the monovalent hydrocarbon group having 1 to 10 carbon atoms represented by R' include a chain hydrocarbon group such as an alkyl group such as a methyl group and an ethyl group; an alicyclic hydrocarbon group such as a cycloalkyl group such as a cyclopentyl group and an adamantyl group; an aromatic hydrocarbon group such as a phenyl group and a benzyl group, and the like.

Among these, $R^2$ represents preferably a divalent group, more preferably a divalent hydrocarbon group or a divalent hydrocarbon group that includes —O— and/or —COO— between adjacent two carbon atoms thereof, still more preferably an alkanediyl group, an alkanediyl group that includes —O— and/or —COO— between adjacent two carbon atoms thereof, or a cycloalkanediyl group that includes —O— and/or —COO— between adjacent two carbon atoms thereof, particularly preferably an alkanediyl group, an alkanediyl group that includes —O— between adjacent two carbon atoms thereof, or a cycloalkanediyl group that includes —O— between adjacent two carbon atoms thereof, and further particularly preferably a methanediyl group, a methanediyloxyethanediyl group, or a methanediyloxycyclohexanediyl group.

Examples of the monovalent organic group having 1 to 20 carbon atoms represented by $R^3$ include a monovalent hydrocarbon group having 1 to 20 carbon atoms, a monovalent hetero atom-containing group in which a hydrocarbon group includes a hetero atom-containing group between adjacent two carbon atoms thereof, and a monovalent group derived from the hydrocarbon group and hetero atom-containing group by replacing a part or all of hydrogen atoms included therein with a substituent, and the like.

Examples of the monovalent hydrocarbon group include:

a chain hydrocarbon groups such as alkyl group such as a methyl group, an ethyl group, a propyl group, and a butyl group;

an alkenyl group such as an ethenyl group, a propenyl group, and a butenyl group;

an alkynyl group such as an ethynyl group, a propynyl group, and a butynyl group;

an alicyclic hydrocarbon group such as a cycloalkyl group such as a cyclopentyl group, a cyclohexyl group, a norbornyl group, and an adamantyl group, and a cycloalkenyl group such as a cyclopentenyl group, a norbornenyl group;

an aromatic hydrocarbon group such as an aryl group such as a phenyl group, a tolyl group, a xylyl group, a naphthyl group, and an anthryl group; and an aralkyl group such as a benzyl group, a phenethyl group, and a naphthylmethyl group; and the like.

In addition, the monovalent hydrocarbon group may be, for example, an acid-labile group such as a t-alkyl group, a 1-alkyl-1-monocyclic cycloalkyl group, and a 2-alkyl-polycyclic cycloalkyl group. The term “acid-labile group” refers to a group which replaces a hydrogen atom included in a carboxy group and is dissociated by an action of an acid.

The hetero atom in the hetero atom-containing group is not particularly limited as long as the hetero atom is an atom other than a carbon atom and a hydrogen atom, and examples thereof include an oxygen atom, a nitrogen atom, a silicon atom, a phosphorus atom, a sulfur atom, and the like.

Examples of the hetero atom-containing group include —CO—, —COO—, —O—, —NR"—, —CS—, —S—, —SO—, $—SO_2—$, a combination thereof, and the like.

Examples of the substituent include a halogen atom such as a fluorine atom, a chlorine atom, a bromine atom, and an iodine atom; a hydroxy group; a carboxy group; a cyano group; a nitro group; an alkoxy group; an alkoxycarbonyl group; an acyl group; an acyloxy group, and the like.

$R^3$ represents preferably a hydrogen atom, a monovalent hydrocarbon group, a monovalent fluorinated hydrocarbon group, or a hydroxy group-containing group; more preferably a hydrogen atom, an alkyl group, a fluorinated alkyl group, and a group having a hydroxy group or a fluorine atom; still more preferably a hydrogen atom, an alkyl group having 1 to 6 carbon atoms, a fluorinated alkyl group having 1 to 6 carbon atoms, and a di-(trifluoromethyl)hydroxymethyl group-containing group having 1 to 6 carbon atoms; and particularly preferably a hydrogen atom, a methyl group, an ethyl group, a 2,2,2-trifluoroethyl group, or a 2-hydroxy-2-trifluoromethyl-1,1,1-trifluoro-4-butyl group.

Group (2)

In the above formula (2), examples of the halogen atom represented by $R^4$ include a fluorine atom, a chlorine atom, a bromine atom, an iodine atom, and the like. Among these, a fluorine atom and a chlorine atom are preferred.

Examples of the alkyl group represented by $R^4$ include a linear alkyl group such as a methyl group, an ethyl group, a n-propyl group, and a n-butyl group; a branched alkyl group such as an i-propyl group, an i-butyl group, a sec-butyl group, and a t-butyl group, and the like. The alkyl group is preferably an alkyl group having 1 to 20 carbon atoms.

Examples of the monovalent alicyclic hydrocarbon group represented by $R^4$ include a monocyclic alicyclic hydrocarbon group such as a cyclopentyl group and a cyclohexyl group; a polycyclic alicyclic hydrocarbon group such as an adamantyl group, a norbornyl group, and a tetracyclodecanyl group, and the like. The alicyclic hydrocarbon group is preferably an alicyclic hydrocarbon group having 3 to 20 carbon atoms.

Examples of the alkoxy group represented by $R^4$ include a methoxy group, an ethoxy group, and the like. The alkoxy group is preferably an alkoxy group having 1 to 20 carbon atoms.

Examples of the acyl group represented by $R^4$ include an acetyl group, a propionyl group, and the like. The acyl group is preferably an acyl group having 2 to 20 carbon atoms.

Examples of the aralkyl group represented by $R^4$ include a benzyl group, a phenethyl group, a naphthylmethyl group, and the like. The aralkyl group is preferably an aralkyl group having 7 to 12 carbon atoms.

Examples of the aryl group represented by $R^4$ include a phenyl group, a tolyl group, a dimethylphenyl group, a 2,4,6-trimethylphenyl group, a naphthyl group, and the like. The aryl group is preferably an aryl group having 6 to 10 carbon atoms.

The substituent which may be included in the alkyl group, monovalent alicyclic hydrocarbon group, alkoxy group, acyl group, aralkyl group and aryl group represented by $R^4$ includes, for example, a halogen atom such as a fluorine atom and a chlorine atom, a hydroxyl group, a nitro group, a cyano group, and the like.

Among these, a hydrogen atom, an alkyl group having 1 to 5 carbon atoms, an alkoxy group having 1 to 5 carbon atoms and an acyl group having 2 to 5 carbon atoms are preferred as $R^4$ in view of the balance between solubility of an upper layer film provided from the composition for forming a liquid immersion upper layer film in developer solutions and peel resistance of the upper layer film, and a hydrogen atom, a methyl group, an ethyl group, and an acetyl group are more preferred.

When $R^5$ represents —C(C═O)—$R^6$ and —S(═O)$_2$—$R^7$, examples of the alkyl group, the monovalent alicyclic hydrocarbon group, the alkoxy group, the aralkyl group and the aryl group represented by $R^6$ and $R^7$ include the same groups as those exemplified as the groups with respect to $R^4$, respectively, and the like. In addition, examples of the fluorinated alkyl group represented by $R^6$ and $R^7$ include a group which is obtained by substituting at least one of hydrogen atoms included in the group exemplified as the alkyl group with respect to $R^4$ by a fluorine atom, and the like. Among these, $R^6$ and $R^7$ are preferably a hydrogen atom and an alkyl group, and more preferably a hydrogen atom, a methyl group, and an ethyl group.

The ring structure-containing group represented by $R^4$ and one of $R^6$ and $R^7$ taken together is preferably a divalent alicyclic hydrocarbon group having 5 to 12 carbon atoms which includes the carbon atom to which each of $R^4$ and one of $R^6$ and $R^7$ bond, as well as an oxo group.

When $R^5$ represents —$R^8$—CN and —$R^9$—$NO_2$, $R^8$ and $R^9$ represent preferably a single bond, a methanediyl group or an ethanediyl group.

As the group (2), groups represented by the following formulae (2-1) to (2-8) are preferred.

(2-1)

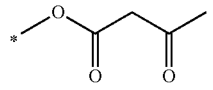

(2-2)

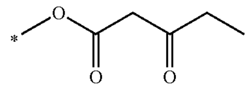

(2-3)

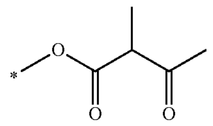

(2-4)

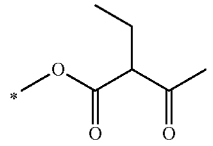

(2-5)

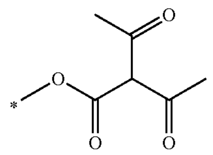

(2-6)

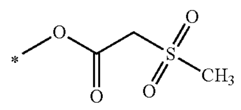

(2-7)

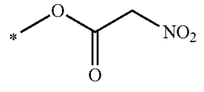

-continued (2-8)

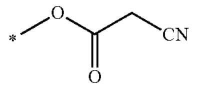

In the above formulae (2-1) to (2-8), * denotes a binding site.

Among these, as the group (2), the groups represented by the above formulae (2-1) to (2-5) are preferred, and the group represented by the above formula (2-1) group and the group represented by the above formula (2-5) are more preferred.

Examples of the structural unit (I) include structural units represented by the following formulae (1-1) to (1-16), and the like.

(1-1)

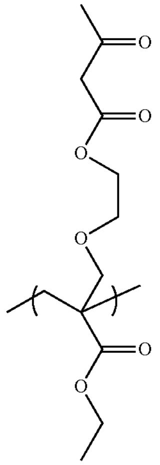

(1-2)

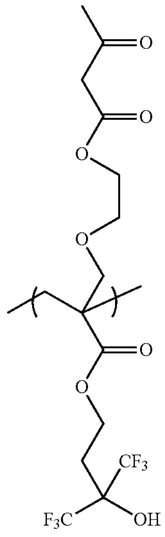

-continued (1-3)

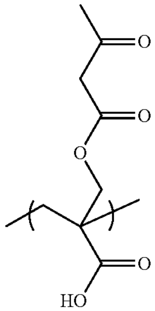

(1-4)

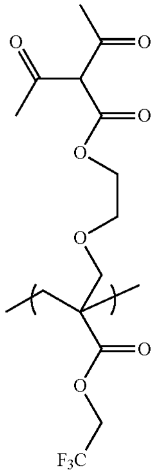

(1-5)

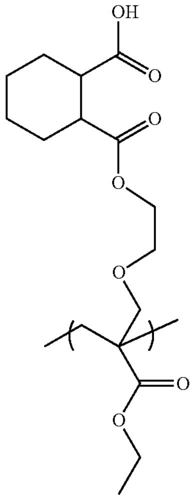

(1-6)

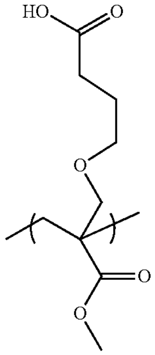

-continued
(1-7)
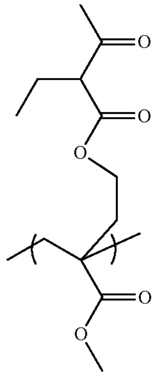
(1-8)
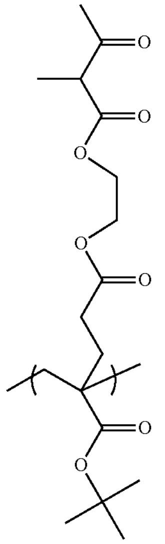
(1-9)
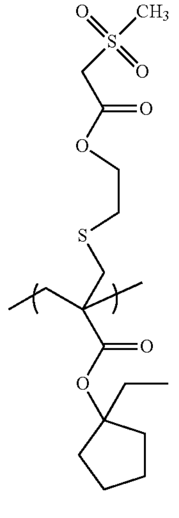
-continued
(1-10)
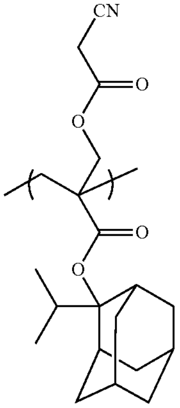
(1-11)
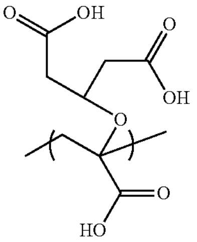
(1-12)
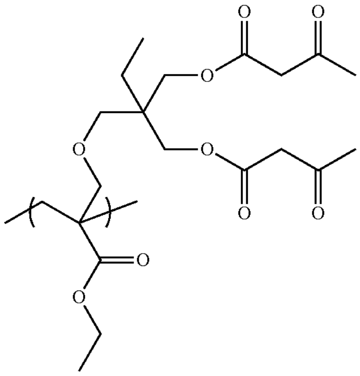
(1-13)
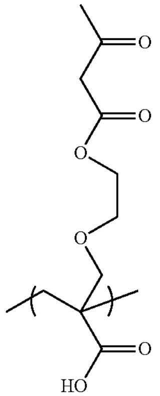

-continued (1-14)

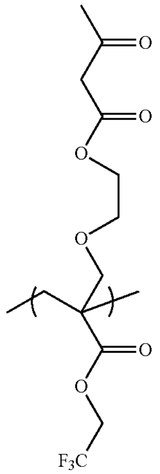

(1-15)

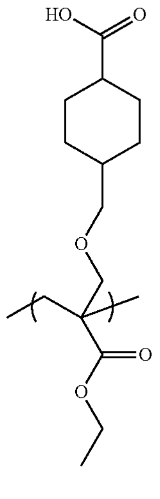

(1-16)

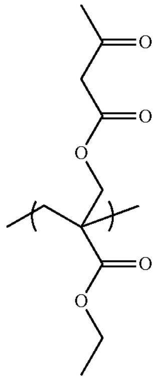

Among these, the structural units each represented by the above formulae (1-1) to (1-6) and (1-13) to (1-16) are preferred.

n is preferably an integer of 1 to 3, more preferably 1 or 2, and still more preferably 1.

The proportion of the structural unit (I) in the polymer component (A) with respect to the entire structural units constituting the polymer component (A) is preferably 1 mol % to 90 mol %, more preferably 3 mol % to 85 mol %, still more preferably 8 mol % to 70 mol %, and particularly preferably 10 mol % to 60 mol %. When the proportion of the structural unit (I) in the polymer component (A) falls within the above range, peel resistance of the resultant liquid immersion upper layer film can be improved.

In addition, the proportion of the structural unit (I) in the polymer (a) with respect to the entire structural units constituting the polymer (a) is preferably 1 mol % to 100 mol %, more preferably 10 mol % to 90 mol %, still more preferably 15 mol % to 85 mol %, even more preferably 30 mol % to 75 mol %. When the proportion of the structural unit (I) in the polymer (a) falls within the above range, the peel resistance of the resultant liquid immersion upper layer film can be improved.

Examples of the compound that gives the structural unit (I) include compounds represented by the following formulae (i-1) to (i-16), and the like.

(i-1)

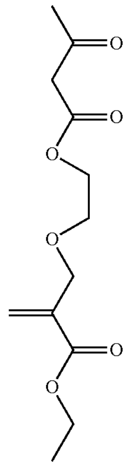

(i-2)

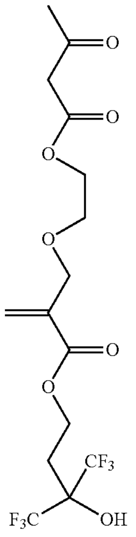

-continued
(i-3)
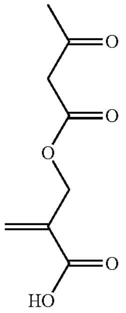
(i-4)
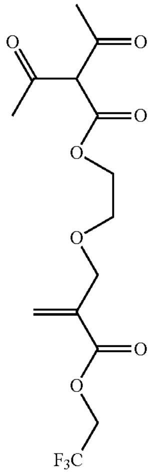
(i-5)
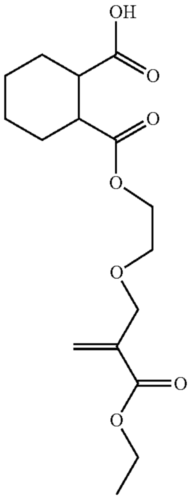
(i-6)
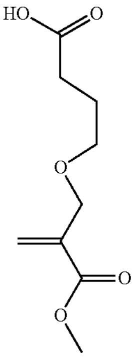
-continued
(i-7)
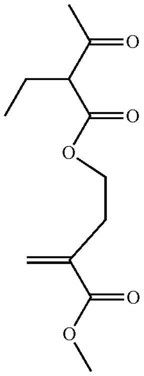
(i-8)
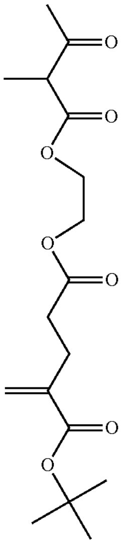
(i-9)
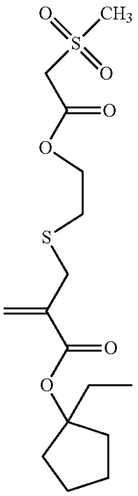

-continued (i-10)

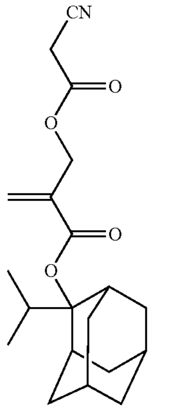

(i-11)

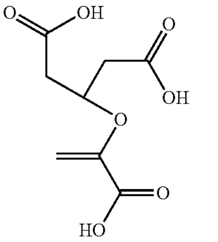

(i-12)

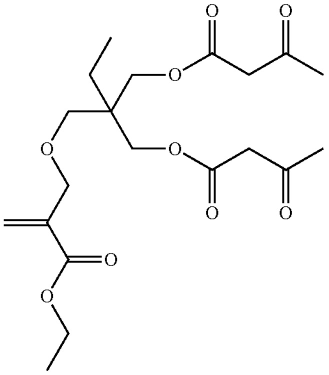

(i-13)

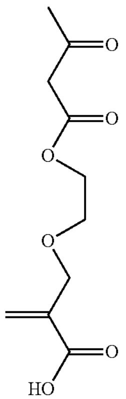

-continued (i-14)

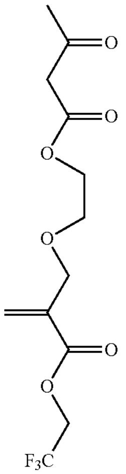

(i-15)

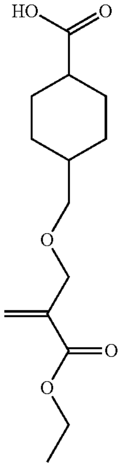

(i-16)

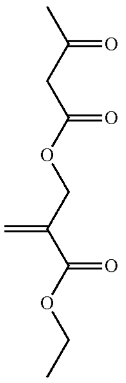

Among these, the compounds each represented by the above formulae (i-1) to (i-6) and (i-13) to (i-16) are preferred.

The polymer (a) constituting the polymer component (A) is obtained by radically polymerizing a monomer that gives the structural unit (I), and a monomer that gives other structural unit as required, as hereinafter described. As an example of a method for producing the compound that gives the structural unit (I), a method for producing a compound represented by the following formula (i') (hereinafter, may be also referred to as "compound (i')") in which $R^2$ represents a —$R^{2a}$—O—$R^{2b}$— (a hydrocarbon group that includes an —O— moiety between adjacent two carbon atoms thereof) is exemplified as follows, and the compound (i') can indeed be produced according to the following method. Other compound (i) than the compound (i') can be produced by any well-known method as well.

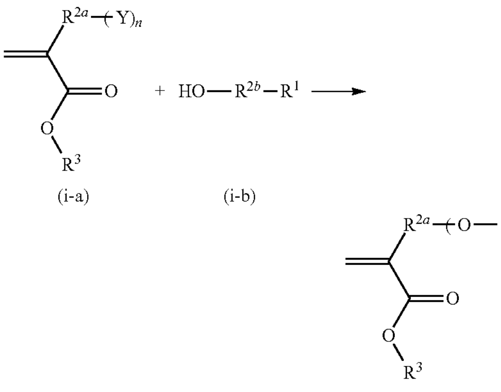

(i-a) (i-b) (i')

In the above formulae (i-a), (i-b) and (i'), $R^1$ represents a carboxy group or the group represented by the above formula (2); $R^{2a}$ represents a hydrocarbon group having a valency of (n+1); $R^{2b}$ represents a divalent hydrocarbon group; $R^3$ represents a hydrogen atom or a monovalent organic group; Y represents a halogen atom; and n is an integer of 1 to 4.

The compound (i') can be obtained by reacting a halogen atom-containing acryl ester compound represented by the above formula (i-a) with a hydroxy group-containing compound represented by the formula (i-b), in a solvent such as ethyl acetate, in the presence of a base compound such as triethylamine.

Examples of the halogen atom represented by Y include a fluorine atom, a halogen atom, a bromine atom, an iodine atom, and the like. Among these, the bromine atom is preferred in view of the yield of the reaction.

Structural Unit (II)

The structural unit (II) is a structural unit that includes a sulfo group. When the structural unit (II) is included in the polymer (a) and/or polymer (b) of the polymer component (A) of the composition for forming a liquid immersion upper layer film, blob defect inhibitory property of the resultant liquid immersion upper layer film can be improved.

Examples of the structural unit (II) include a structural unit represented by the following formula (3), and the like.

(3)

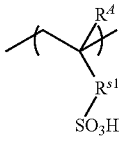

In the above formula (3), $R^A$ represents a hydrogen atom, a methyl group, a fluorine atom or a trifluoromethyl group; and $R^{s1}$ represents a single bond, an oxygen atom, a sulfur atom, a divalent chain hydrocarbon group having 1 to 6 carbon atoms, a divalent alicyclic hydrocarbon group having 4 to 12 carbon atoms, a divalent aromatic hydrocarbon group having 6 to 12 carbon atoms or —C(C═O)—X'—R', wherein, X' represents an oxygen atom, a sulfur atom or an NH group, and R' represents a single bond, a divalent chain hydrocarbon group having 1 to 6 carbon atoms, a divalent alicyclic hydrocarbon group having 4 to 12 carbon atoms or a divalent aromatic hydrocarbon group having 6 to 12 carbon atoms.

$R^A$ represents preferably a hydrogen atom or a methyl group in view of copolymerizability of a monomer that gives the structural unit (II) and the like, and more preferably a methyl group.

Examples of the divalent chain hydrocarbon group having 1 to 6 carbon atoms and divalent alicyclic hydrocarbon group having 4 to 12 carbon atoms represented by $R^{s1}$ and R' include the same divalent chain hydrocarbon group and divalent alicyclic hydrocarbon group as those exemplified as X in the above formula (1) as long as the carbon number thereof falls within the specified range, and the like.

Examples of the divalent aromatic hydrocarbon group having 6 to 12 carbon atoms represented by $R^{S1}$ include the same divalent aromatic hydrocarbon group as those exemplified as X in the above formula (1) as long as the carbon number thereof falls within the specified range, and the like.

$R^{S1}$ represents preferably a single bond, a divalent chain hydrocarbon group having 1 to 6 carbon atoms, a divalent aromatic hydrocarbon having 6 to 12 carbon atoms, or a —C(C═O)—NH—R' in which R' represents a divalent chain hydrocarbon group having 1 to 6 carbon atoms; more preferably a single bond, a methanediyl group, a phenylene group, or —C(C═O)—NH—CH($CH_3$)—$CH_2$—; and still more preferably a single bond or —C(C═O)—NH—CH($CH_3$)—$CH_2$—.

Examples of the structural unit (II) include structural units represented by the following formulae (3-1) to (3-4), and the like.

(3-1)

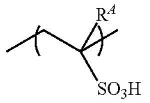

(3-2)

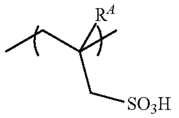

(3-3)

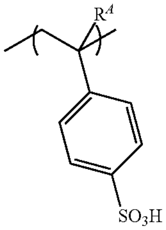

(3-4)

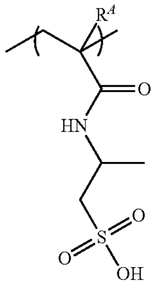

In the above formulae (3-1) to (3-4), $R^A$ is as defined in the above formula (3).

Among these, the structural unit represented by the above formula (3-1) and the structural unit represented by the above formula (3-4) are preferred.

The proportion of the structural unit (II) in the polymer component (A) with respect to the entire structural units constituting the polymer component (A) is preferably 0 mol % to 10 mol %, more preferably 0.1 mol % to 5 mol %, and still more preferably 0.2 mol % to 2 mol %. When the proportion of the structural unit (II) in the polymer component (A) falls within the above range, blob defects can be further inhibited.

The proportion of the structural unit (II) in the polymer (a) with respect to the entire structural units constituting the polymer (a) is preferably 0 mol % to 20 mol %, more preferably 0.2 mol % to 10 mol %, and still more preferably 0.5 mol % to 7 mol %. When the proportion of the structural unit (IV) in the polymer (a) falls within the above range, the blob defects can be further inhibited.

The proportion of the structural unit (II) in the polymer (b) with respect to the entire structural units constituting the polymer (b) is preferably 0 mol % to 20 mol %, more preferably 0.2 mol % to 10 mol %, and still more preferably 0.5 mol % to 7 mol %. When the proportion of the structural unit (II) in the polymer (b) falls within the above range, the blob defects can be further inhibited.

Structural Unit (III)

The structural unit (III) is a structural unit that includes a fluorinated alkyl group or a fluorinated cycloalkyl group. When the structural unit (II) is included in the polymer (a) and/or polymer (b) of the polymer component (A) of the composition for forming a liquid immersion upper layer film, water repellency of the resultant liquid immersion upper layer film can be further increased.

Examples of the fluorinated alkyl group include a trifluoromethyl group, a difluoroethyl group, a trifluoroethyl group, a perfluoroethyl group, a trifluoropropyl group, a hexafluoro-i-propyl group, a perfluoro-n-butyl group, a perfluoro-n-octyl group, and the like.

Examples of the fluorinated cycloalkyl group include a fluorocyclopropyl group, a fluorocyclobutyl group, a fluorocyclopentyl group, a difluorocyclopentyl group, a tetrafluorocyclopentyl group, a perfluorocyclopentyl group, a tetrafluorocyclohexyl group, a difluoronorbornyl group, a perfluoroadamantyl group, and the like.

As the structural unit (III), a structural unit represented by the following formula (4) is preferred.

(4)

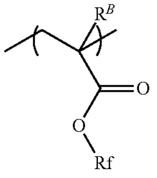

In the above formula (4), $R^B$ represents a hydrogen atom, a methyl group, a fluorine atom or a trifluoromethyl group; and Rf represents a fluorinated alkyl group or a fluorinated cycloalkyl group.

$R^B$ represents preferably a hydrogen atom or a methyl group in view of copolymerizability of a monomer that gives the structural unit (III) and the like, and more preferably a methyl group.

Rf represents preferably a fluorinated alkyl group, more preferably a fluorinated alkyl group having 1 to 4 carbon atoms, still more preferably a fluorinated alkyl group having 2 or 3 carbon atoms, and particularly preferably a 2,2,2-trifluoroethyl group or a 1,1,1,3,3,3-hexafluoro-2-propyl group.

Examples of the structural unit (III) include structural units represented by the following formulae (4-1) to (4-6), and the like.

(4-1)

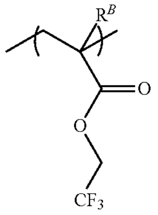

(4-2)

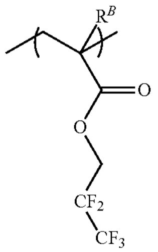

(4-3)

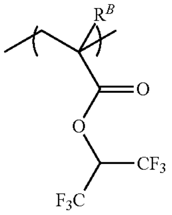

(4-4)

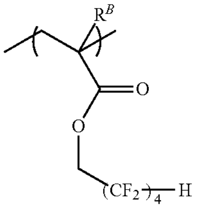

(4-5)

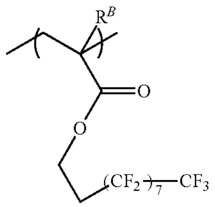

-continued (4-6)

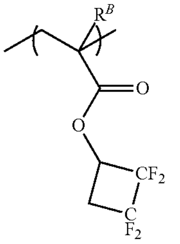

In the above formulae (4-1) to (4-6), $R^B$ is as defined in the above formula (4).

Among these, the structural unit represented by the above formula (4-1) and the structural unit represented by the formula (4-3) are preferred.

The proportion of the structural unit (III) in the polymer component (A) with respect to the entire structural units constituting the polymer component (A) is preferably 0 mol % to 30 mol %, more preferably 1 mol % to 25 mol %, and still more preferably 2 mol % to 20 mol %. When the proportion of the structural unit (II) in the polymer component (A) falls within the above range, the water repellency of the liquid immersion upper layer film provided from the composition for forming a liquid immersion upper layer film can be improved to a higher extent.

The proportion of the structural unit (III) in the polymer (a) with respect to the entire structural units constituting the polymer (a) is preferably 0 mol % to 70 mol %, more preferably 5 mol % to 65 mol %, and still more preferably 10 mol % to 60 mol %. When the proportion of the structural unit (III) in the polymer (a) falls within the above range, the water repellency of the liquid immersion upper layer film provided from the composition for forming a liquid immersion upper layer film can be improved to a higher extent.

The proportion of the structural unit (III) in the polymer (b) with respect to the entire structural units constituting the polymer (b) is preferably 0 mol % to 70 mol %, more preferably 10 mol % to 65 mol %, and still more preferably 30 mol % to 60 mol %. When the proportion of the structural unit (III) in the polymer (a) falls within the above range, the water repellency of the liquid immersion upper layer film provided from the composition for forming a liquid immersion upper layer film can be improved to a higher extent.

Structural Unit (IV)

The structural unit (IV) is a structural unit other than the structural unit (III) and includes a group represented by the following formula (5) (a fluorinated sulfonamide group), a group represented by the following formula (6) (an α-trifluoromethyl alcohol group) or a combination thereof (hereinafter, the structural unit that includes the group represented by the following formula (5) may be also referred to as "structural unit (IV-1)", and the structural unit that includes the group represented by the following formula (6) may be also referred to as "structural unit (IV-2)"). When the structural unit (III) is included in the polymer (a) and/or polymer (b) of the polymer component (A) of the composition for forming a liquid immersion upper layer film, the water repellency and removability of the resultant liquid immersion upper layer film can be improved.

(5)

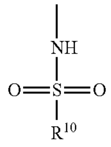

(6)

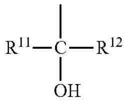

In the above formula (5), $R^{10}$ represents a monovalent fluorinated hydrocarbon group having 1 to 20 carbon atoms.

In the above formula (6), $R^{11}$ represents a monovalent fluorinated hydrocarbon group having 1 to 20 carbon atoms; and $R^{12}$ represents a hydrogen atom or a monovalent organic group having 1 to 20 carbon atoms.

Examples of the monovalent fluorinated hydrocarbon group having 1 to 20 carbon atoms represented by $R^{10}$ and $R^{11}$ include:

a fluorinated chain hydrocarbon group such as fluorinated alkyl groups such as a fluoromethyl group, a difluoromethyl group, a trifluoromethyl group, a trifluoroethyl group, a perfluoroethyl group, and a perfluorobutyl group;

a fluorinated alkenyl group such as a fluoroethenyl group, a perfluoroethenyl group; and a fluorinated alkynyl group such as a fluoroethynyl group and a fluoropropynyl group;

a fluorinated alicyclic hydrocarbon group such as a fluorinated cyclopropyl group such as a fluorocyclopentyl group, a tetrafluorocyclohexyl group, a fluoronorbornyl group, and a fluoroadamantyl group, and a fluorinated cycloalkenyl group such as a fluorocyclopentenyl group and a difluoronorbornenyl group;

a fluorinated aromatic hydrocarbon group such as fluorinated aryl groups such as a fluorophenyl group and a trifluoronaphthyl group;

a fluorinated alkenyl group such as a fluorobenzyl group and a difluorophenethyl group; and the like.

Examples of the monovalent organic group represented by $R^{12}$ include the same groups as the monovalent organic group exemplified hereinabove as $R^3$, and the like.

Examples of the structural unit (IV-1) include a structural unit represented by the following formula (5-1) (hereinafter, may be also referred to as "structural unit (IV-1a)"), and the like.

(5-1)

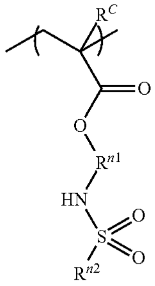

In the above formula (5-1), $R^C$ represents a hydrogen atom, a methyl group, a fluorine atom or a trifluoromethyl group; and $R''^1$ represents a divalent linking group. $R''^2$ represents a fluorinated alkyl group having 1 to 20 carbon atoms.

$R^C$ represents preferably a hydrogen atom or a methyl group in view of copolymerizability of a monomer that gives the structural unit (IV-1a) and the like, and more preferably a methyl group.

Examples of the divalent linking group represented by $R''^1$ include a divalent chain hydrocarbon group having 1 to 6 carbon atoms, a divalent alicyclic hydrocarbon group having 4 to 12 carbon atoms, a divalent chain hydrocarbon group having 1 to 6 carbon atoms that includes —O—, —CO—, and —COO— between adjacent two carbon atoms thereof, a divalent alicyclic hydrocarbon group having 4 to 12 carbon atoms that includes —O—, —CO—, and —COO— between adjacent two carbon atoms thereof, and the like.

Examples of the divalent chain hydrocarbon group having 1 to 6 carbon atoms include:

an alkanediyl group such as a methanediyl group, a 1,2-ethanediyl group, a 1,1-ethanediyl group, a 1,3-propanediyl group, a 1,2-propanediyl group, a 1,1-propanediyl group, a 2,2-propanediyl group, a 1,4-propanediyl group, a 1,5-pentanediyl group, a 1,6-hexanediyl group, a 1-methyl-1,3-propanediyl group, a 2-methyl-1,3-propanediyl group, a 2-methyl-1,2-propanediyl group, a 1-methyl-1,4-butanediyl group, and a 2-methyl-1,4-butanediyl group;

an alkenediyl group such as a 1,2-ethenediyl group, a 1,3-propenediyl group, and a 1,2-propenediyl group;

an alkynediyl group such as a 1,2-ethynediyl group; and the like.

Examples of the divalent alicyclic hydrocarbon group having 4 to 12 carbon atoms include:

a monocyclic cycloalkanediyl group such as a cyclobutanediyl group such as a 1,3-cyclobutanediyl group; cyclopentanediyl groups such as a 1,3-cyclopentanediyl group; a cyclohexanediyl group such as a 1,4-cyclohexanediyl group and 1,2-cyclohexanediyl group; and a cyclooctanediyl group such as a 1,5-cyclooctanediyl group;

a polycyclic cycloalkanediyl group such as a norbornanediyl group such as a 1,4-norbornanediyl group and a 2,5-norbornanediyl group, an adamantanediyl group such as a 1,3-adamantanediyl group and a 2,4-adamantanediyl group;

a monocyclic cycloalkenediyl group such as a 1,2-cyclopentenediyl group;

a polycyclic cycloalkenediyl group such as a 1,2-norbornenediyl group; and the like.

Among these, $R''^1$ represents preferably a divalent chain hydrocarbon group having 1 to 3 carbon atoms, more preferably an alkanediyl group having 1 to 3 carbon atoms, and still more preferably a 1,2-ethanediyl group.

Examples of the fluorinated alkyl group having 1 to 20 carbon atoms represented by $R''^2$ include a fluoromethyl group, a difluoromethyl group, a trifluoromethyl group, a trifluoroethyl group, a pentafluoromethyl group, a heptafluoropropyl group, a nonafluorobutyl group, and the like. Among these, a trifluoromethyl group is preferred.

Examples of the structural unit (IV-2) include a structural unit represented by the following formula (6-1) (hereinafter, may be also referred to as "structural unit (IV-2a)"), and the like.

(6-1)

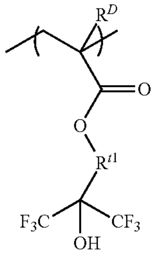

In the above formula (6-1), $R^D$ represents a hydrogen atom, a fluorine atom, a methyl group or a trifluoromethyl group; and $R^{t1}$ represents a divalent linking group.

$R^D$ represents preferably a hydrogen atom or a methyl group in view of copolymerizability of a monomer that gives the structural unit (IV-2a) and the like, and more preferably a methyl group.

Examples of the divalent linking group represented by $R^{t1}$ include the same groups as those exemplified as $R''^1$ in the above formula (5-1), and the like. Among these, $R^{t1}$ is preferably a divalent chain hydrocarbon group having 1 to 3 carbon atoms and a divalent alicyclic hydrocarbon group having 4 to 12 carbon atoms, more preferably a propanediyl group, a divalent group having a cyclohexane skeleton, a divalent group having a norbornane skeleton, a divalent group having a tetracyclododecane skeleton, and a divalent group having an adamantane skeleton, and still more preferably a 1,2-propanediyl group and a 1-cyclohexyl-1,2-ethanediyl group.

Examples of the structural unit (IV-2a) include structural units represented by the following formulae (6-1-1) to (6-1-8), and the like.

(6-1-1)

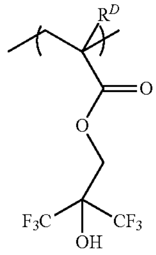

(6-1-2)

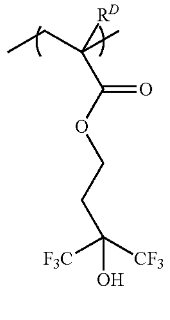

-continued (6-1-3)

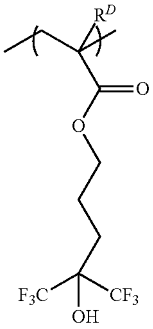

(6-1-4)

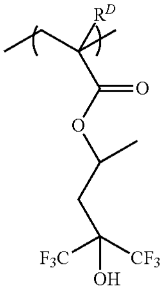

(6-1-5)

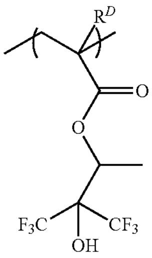

(6-1-6)

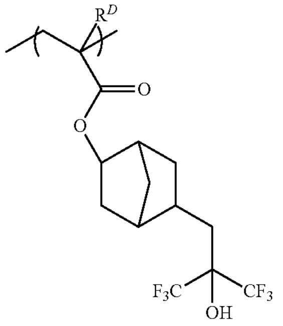

(6-1-7)

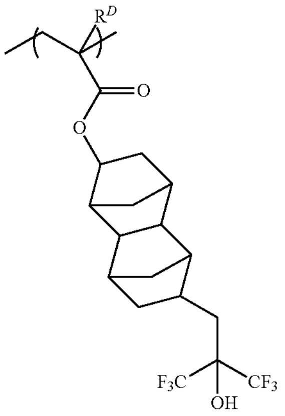

-continued (6-1-8)

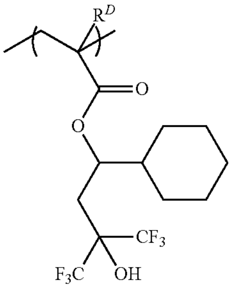

In the above formulae (6-1-1) to (6-1-8), $R^D$ is as defined in the above formula (6-1).

Among these, the structural unit represented by the above formula (6-1-4) and the structural unit represented by the above formula (6-1-8) are preferred.

The proportion of the structural unit (IV) in the polymer component (A) with respect to the entire structural units constituting the polymer component (A) is preferably 0 mol % to 98 mol %, more preferably 5 mol % to 95 mol %, still more preferred 30 mol % to 95 mol %, and particularly preferably 60 mol % to 90 mol %. When the proportion of the structural unit (III) in the polymer component (A) falls within the above range, water repellency and removability of the liquid immersion upper layer film provided from the composition for forming a liquid immersion upper layer film can be further improved.

The proportion of the structural unit (IV) in the polymer (a) with respect to the entire structural units constituting the polymer (a) is preferably 0 to 90 mol %, more preferably 10 mol % to 85 mol %, and still more preferably 30 mol % to 70 mol %. When the proportion of the structural unit (IV) in the polymer (a) falls within the above range, the water repellency and upper layer film removability of the liquid immersion upper layer film provided from the composition for forming a liquid immersion upper layer film can be improved to a higher extent.

The proportion of the structural unit (IV) in the polymer (b) with respect to the entire structural units constituting the polymer (b) is preferably 0 to 99 mol %, more preferably 30 mol % to 99 mol %, and still more preferably 60 mol % to 98 mol %. When the proportion of the structural unit (IV) in the polymer (b) falls within the above range, water repellency and removability of the liquid immersion upper layer film provided from the composition for forming a liquid immersion upper layer film can be further improved.

Structural Unit (V)

The structural unit (V) is at least one types of structural unit selected from the group consisting of a structural unit represented by the following formula (7) (hereinafter, may be also referred to as "structural unit (V−1)") and a structural unit represented by the following formula (8) (hereinafter, may be also referred to as "structural unit (V-2)"). When the polymer component (A) has the structural unit (V), removability and peel resistance of the upper layer film provided from the composition for forming a liquid immersion upper layer film can be improved.

(7)

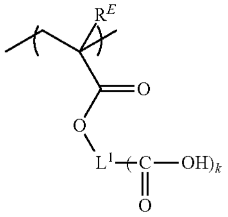

(8)

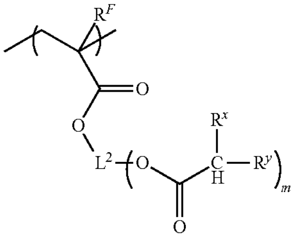

In the above formula (7), $R^E$ represents a hydrogen atom, a fluorine atom, a methyl group or a trifluoromethyl group; and k is an integer of 0 to 3, wherein in a case where k is 1 to 3, $L^1$ represents a linking group having a valency of (k+1); whereas in a case where k is 0, $L^1$ represents a hydrogen atom.

In the above formula (8), $R^F$ represents a hydrogen atom, a fluorine atom, a methyl group or a trifluoromethyl group; $L^2$ represents a linking group having a valency of (m+1); m is an integer of 1 to 3; $R^x$ represents a hydrogen atom, a halogen atom, a nitro group, an alkyl group, a monovalent alicyclic hydrocarbon group, an alkoxy group, an acyl group, an aralkyl group or an aryl group, wherein a part or all of hydrogen atoms included in the alkyl group, the alicyclic hydrocarbon group, the alkoxy group, the acyl group, the aralkyl group and the aryl group represented by $R^x$ are not substituted or substituted; and Ry represents —C(═O)—$R^a$, —S(═O)$_2$—$R^b$, —$R^c$—CN or —$R^d$—$NO_2$; $R^a$ and $R^b$ each independently represent a hydrogen atom, an alkyl group, a fluorinated alkyl group, a monovalent alicyclic hydrocarbon group, an alkoxy group, a cyano group, a cyanomethyl group, an aralkyl group or an aryl group, wherein, $R^a$ or $R^b$ and $R^x$ may taken together represent a ring structure; and $R^c$ and $R^d$ each independently represent a single bond, a methylene group or an alkylene group having 2 to 5 carbon atoms.

$R^E$ and $R^F$ represent preferably a hydrogen atom or a methyl group in view of copolymerizability of a monomer that gives the structural unit (V) and the like, and more preferably a methyl group.

Examples of the linking group having a valency of (k+1) represented by $L^1$ and the linking group having a valency of (m+1) represented by $L^2$ include as a divalent linking group (in the case of k and m being 1), an alkanediyl group, a divalent cycloalkanediyl group, an alkenediyl group, an arenediyl group, and the like. Here, a part or all of hydrogen atoms included in these groups are not substituted or substituted with a halogen atom such as a fluorine atom and a chlorine atom, a cyano group, or the like.

Examples of the alkanediyl group include a methanediyl group, an ethanediyl group, a propanediyl group, a butanediyl group, a hexanediyl group, an octanediyl group, and the like. An alkanediyl group having 1 to 8 carbon atoms is preferred as the alkanediyl group.

Examples of the cycloalkanediyl group include a monocyclic cycloalkanediyl group such as a cyclopentanediyl group and a cyclohexanediyl group; a polycyclic cycloalkanediyl group such as a norbornanediyl group and an adamantanediyl group, and the like. A cycloalkanediyl group having 5 to 12 carbon atoms is preferred as the cycloalkanediyl group.

Examples of the alkenediyl group include an ethenediyl group, a propenediyl group, a butenediyl group, and the like. An alkenediyl group having 2 to 6 carbon atoms is preferred as the alkenediyl group.

Examples of the arenediyl group include a phenylene group, a tolylene group, a naphthylene group, and the like. An arenediyl group having 6 to 15 carbon atoms is preferred as the arenediyl group.

Among these, $L^1$ and $L^2$ are preferably an alkanediyl group and a cycloalkanediyl group, and more preferably an alkanediyl group having 1 to 4 carbon atoms and a cycloalkanediyl group having 6 to 11 carbon atoms. It is preferred that $L^1$ and $L^2$ are a cycloalkanediyl group, in view of the enhancement of the water repellency of the liquid immersion upper layer film provided from the composition for forming a liquid immersion upper layer film.

Examples of the above $R^x$, $R^y$, $R^a$, $R^b$, $R^c$ and $R^d$ include the same groups as those exemplified as $R^4$, $R^5$, $R^6$, $R^7$, $R^8$ and $R^9$ in the formula (2) of the structural unit (I), respectively, and the like.

k is preferably an integer of 0 to 2, more preferably 0 or 1, and still more preferably 1.

m is preferably 1 or 2, and more preferably 1.

Examples of the structural unit (V-1) include structural units represented by the following formulae (7-1) to (7-3) (hereinafter, these may be also referred to collectively as "structural unit (V-1a)"), and the like.

(7-1)

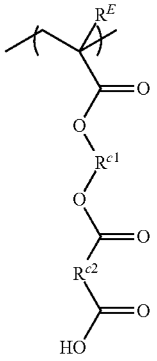

(7-2)

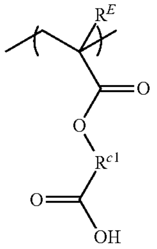

(7-3)

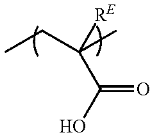

In the above formulae (7-1) to (7-3), $R^E$ is as defined in the above formula (7).

In the above formulae (7-1) and (7-2), $R^{c1}$ and $R^{c2}$ each independently represent a divalent chain hydrocarbon group having 1 to 6 carbon atoms, a divalent alicyclic hydrocarbon group having 4 to 12 carbon atoms or a divalent aromatic hydrocarbon group having 6 to 12 carbon atoms.

Examples of the divalent chain hydrocarbon group having 1 to 6 carbon atoms and the divalent alicyclic hydrocarbon group having 4 to 12 carbon atoms represented by $R^{c1}$ and $R^{c2}$ include the same groups as those exemplified as $R^{n1}$ in the above formula (5-1), and the like. Among these, a saturated chain hydrocarbon group and a monocyclic hydrocarbon group are preferred, and a 1,2-ethanediyl group and a 1,2-cyclohexanediyl group are more preferred.

Examples of the divalent aromatic hydrocarbon group having 6 to 12 carbon atoms represented by $R^{c1}$ and $R^{c2}$ include the same groups as those exemplified as $R^{s1}$ in the above formula (3), and the like.

Examples of the structural unit (V-1a) include structural units represented by the following formulae (7-1-1) to (7-1-3), structural units represented by the following formula (7-2-1) and (7-2-2), and the like.

(7-1-1)

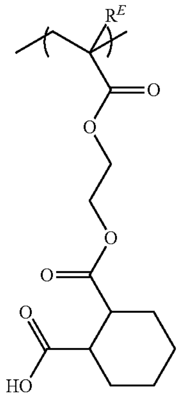

(7-1-2)

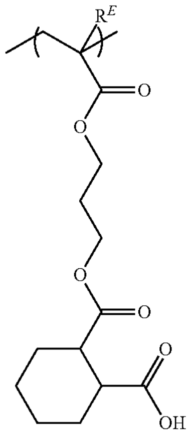

-continued (7-1-3)

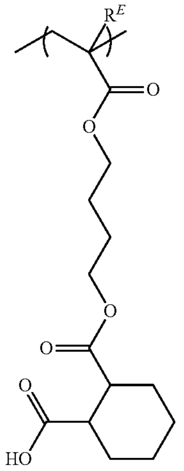

(7-2-1)

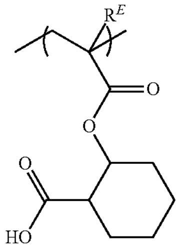

(7-2-2)

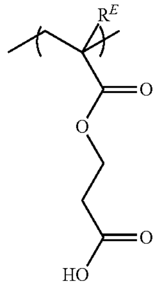

In the above formulae (7-1-1) to (7-1-3) and (7-2-1) and (7-2-2), $R^E$ is as defined in the above formula (7).

The structural unit (V-1a) is preferably the structural unit represented by the above formula (7-1), and the structural unit represented by the formula (7-3). Moreover, among the structural units represented by the above formula (7-1), the structural unit represented by the formula (7-1-1) is preferred.

Examples of the structural unit (V-2) include structural units represented by the following formulae (8-1) to (8-10), and the like.

-continued
(8-1)
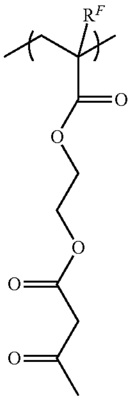
(8-2)
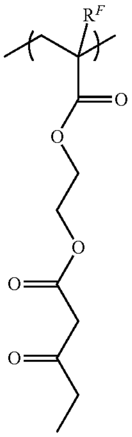
(8-3)
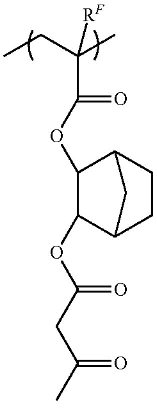
(8-4)
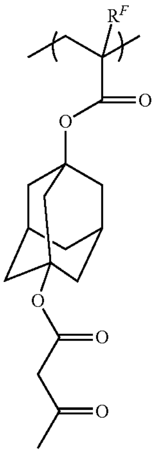
(8-5)
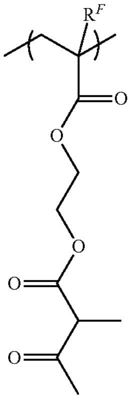
(8-6)
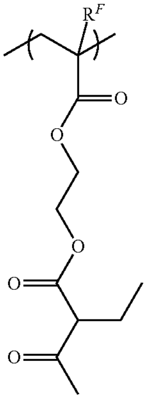

-continued (8-7)

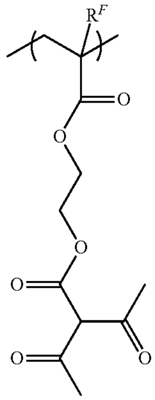

(8-8)

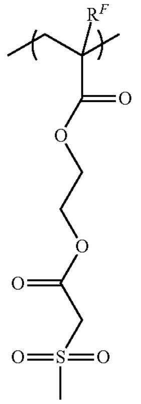

(8-9)

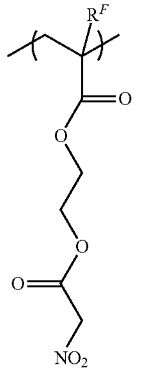

(8-10)

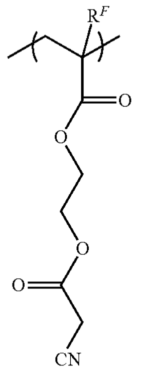

In the above formulae (8-1) to (8-10), $R^F$ is as defined in the above formula (8).

The proportion of the structural unit (V) in the polymer component (A) with respect to the entire structural units constituting the polymer component (A) is preferably 0 mol % to 30 mol %, more preferably 1 mol % to 20 mol %, and still more preferably 4 mol % to 15 mol %. When the proportion of the structural unit (V) in the polymer component (A) falls within the above range, the upper layer film removability and peel resistance of the liquid immersion upper layer film provided from the composition for forming a liquid immersion upper layer film can be further improved.

The proportion of the structural unit (V) in the polymer (a) with respect to the entire structural units constituting the polymer (a) is preferably 0 mol % to 50 mol %, more preferably 0 mol % to 30 mol %, and still more preferably 0 mol % to 10 mol %. When the proportion of the structural unit (V) in the polymer (a) falls within the above range, the upper layer film removability and peel resistance of the liquid immersion upper layer film provided from the composition for forming a liquid immersion upper layer film can be further improved.

The proportion of the structural unit (V) in the polymer (b) with respect to the entire structural units constituting the polymer (b) is preferably 0 mol % to 98 mol %, more preferably 20 mol % to 98 mol %, and still more preferably 60 mol % to 98 mol %. When the proportion of the structural unit (V) in the polymer (b) falls within the above range, the upper layer film removability and peel resistance of the liquid immersion upper layer film provided from the composition for forming a liquid immersion upper layer film can be improved to a higher extent.

Other Structural Unit

The polymer component (A) may include other structural unit, in addition to the structural units (I) to (V), in a polymer identical to or different from the polymer (a). In view of improvement of water repellency, the other structural unit may be exemplified by a structural unit derived from alkyl (meth)acrylates such as propyl (meth)acrylate, butyl (meth) acrylate, and lauryl (meth)acrylate, and the like. Alternatively, in view of the control of a molecular weight, a glass transition point, solubility in a solvent and the like of the polymer component (A), the other structural unit may be exemplified by a structural unit that includes an acid-labile group, and the like. The proportion of the other structural unit in the polymer component (A) with respect to the entire structural units constituting the polymer component (A) is typically no greater than 20 mol %, and preferably no greater than 10 mol %. The proportion of the other structural unit in the polymer (a) with respect to the entire structural units constituting the polymer (a) is typically no greater than 20 mol %, and preferably no greater than 10 mol %. The proportion of the other structural unit in the polymer (b) with respect to the entire structural units constituting the polymer (b) is typically no greater than 20 mol %, and preferably no greater than 10 mol %.

The content of the polymer (a) in the polymer component (A) (mass ratio of the polymer (a) to the total of the polymer (a) and the polymer (b)) is preferably no less than 5% by mass, more preferably 7% by mass to 90% by mass, still more preferably 15% by mass to 85% by mass, and particularly preferably 25% by mass to 75% by mass.

The content of the polymer (b) in the polymer component (A) (mass ratio of the polymer (b) to the total of the polymer (a) and the polymer (b)) is preferably no greater than 95% by mass, more preferably 10% by mass to 93% by mass, still more preferably 15% by mass to 85% by mass, and particularly preferably 25% by mass to 75% by mass.

Synthesis Method of Polymer Component (A)

The polymer (a) and polymer (b), which constitute the polymer component (A) can be synthesized, for example, by polymerizing, e.g., radically polymerizing a predetermined monomer in a polymerization solvent in the presence of an appropriately selected polymerization initiator and/or chain transfer agent.

Examples of the polymerization solvent include:

alcohols such as methanol, ethanol, 1-propanol, 2-propanol, 1-butanol, 2-butanol, ethylene glycol, diethylene glycol, and propylene glycol;

cyclic ethers such as tetrahydrofuran and dioxane;

alkyl ethers of polyhydric alcohols such as ethylene glycol monomethyl ether, ethylene glycol monoethyl ether, ethylene glycol dimethyl ether, ethylene glycol diethyl ether, diethylene glycol monomethyl ether, diethylene glycol monoethyl ether, diethylene glycol dimethyl ether, diethylene glycol diethyl ether, diethylene glycol ethyl methyl ether, propylene glycol monomethyl ether, and propylene glycol monoethyl ether;

alkyl ether acetates of polyhydric alcohols such as ethylene glycol ethyl ether acetate, diethylene glycol ethyl ether acetate, propylene glycol ethyl ether acetate, and propylene glycol monomethyl ether acetate;

aromatic hydrocarbons such as toluene and xylene;

ketones such as acetone, methyl ethyl ketone, methyl isobutyl ketone, cyclohexanone, 4-hydroxy-4-methyl-2-pentanone, and diacetone alcohol;

esters such as ethyl acetate, butyl acetate, methyl 2-hydroxypropionate, ethyl 2-hydroxy-2-methylpropionate, ethyl 2-hydroxy-2-methylpropionate, ethyl ethoxyacetate, ethyl hydroxyacetate, methyl 2-hydroxy-3-methylbutanate, methyl 3-methoxypropionate, ethyl 3-methoxypropionate, ethyl 3-ethoxypropionate, and methyl 3-ethoxypropionate, and the like.

Among these, the cyclic ethers, alkyl ethers of polyhydric alcohols, alkyl ether acetates of polyhydric alcohols, ketones or esters are preferred. Herein, the polymerization solvent may be used either alone, or in combination of two or more thereof.

The polystyrene equivalent weight average molecular weight (Mw) of the polymer component (A) as determined by gel permeation chromatography (GPC) is preferably 2,000 to 50,000, more preferably 3,000 to 30,000, still more preferably 5,000 to 20,000, and particularly preferably 6,000 to 13,000. When the Mw of the polymer component (A) is no less than the above lower limit, water resistance and mechanical characteristic as a liquid immersion upper layer film can be improved; and when the Mw is no greater than the upper limit, solubility of the polymer component (A) in a solvent can be increased. The Mw of the polymer (a) is preferably 2,000 to 50,000, more preferably 3,000 to 30,000, still more preferably 5,000 to 20,000, and particularly preferably 7,000 to 12,000. The Mw of the polymer (b) is preferably 2,000 to 50,000, more preferably 3,000 to 30,000, still more preferably 5,000 to 20,000, and particularly preferably 8,000 to 12,000.

The ratio (Mw/Mn) of the Mw to the polystyrene equivalent number average molecular weight (Mn) as determined by a GPC of the polymer component (A) is preferably 1 to 5, more preferably 1 to 3, and still more preferably 1 to 2.5. The Mw/Mn of the polymer (a) is preferably 1 to 5, more preferably 1 to 3, and still more preferably 1 to 2.5. The Mw/Mn of the polymer (b) is preferably 1 to 5, more preferably 1 to 3, and still more preferably 1 to 2.

Preferably, the composition for forming a liquid immersion upper layer film contains impurities such as halogen ions and metals in an amount as low as possible. A decrease in the amount of impurities can lead to improvement of coating properties as the liquid immersion upper layer film, and of uniform solubility in an alkaline developer solution. Examples of a method for purifying the polymer component (A) to lessen the impurities includes, a chemical purification method such as, for example, water-rinsing, liquid-liquid extraction, and filtration through a demetallizing filter, a combination of the chemical purification method and a physical purification method such as ultrafiltration and centrifugal separation, and the like.

The content of the polymer component (A) with respect to the total solid content of the composition for forming a liquid immersion upper layer film is preferably no less than 70% by mass, more preferably no less than 80% by mass, and still more preferably no less than 90% by mass.

(B) Solvent

The composition for forming a liquid immersion upper layer film includes (B) a solvent. Any solvent may be used as the solvent (B) as long as it can dissolve or disperse the polymer component (A) and the optional component included as required; however, a solvent hardly causing impairment of lithography performances due to excessive intermixing with a resist film and the like, during the coating of the composition for forming a liquid immersion upper layer film to the resist film can be suitably used.

Examples of the solvent (B) include alcohol solvents, ether solvents, hydrocarbon solvents, ketone solvents, ester solvents, water, and the like.

Examples of the alcohol solvents include:

monohydric alcohols such as butanol and pentanol;

polyhydric alcohols such as ethylene glycol and propylene glycol, and the like.

Examples of the ether solvents include:

partial alkyl ethers of polyhydric alcohols such as ethylene glycol monomethyl ether and ethylene glycol monoethyl ether;

alkyl ethers of polyhydric alcohols such as ethylene glycol dimethyl ether, ethylene glycol methyl ethyl ether, ethylene glycol diethyl ether, and diethylene glycol dimethyl ether;

alkyl ether acetates of polyhydric alcohols such as ethylene glycol monomethyl ether acetate, ethylene glycol monoethyl ether acetate, diethylene glycol monomethyl ether acetate, and diethylene glycol monoethyl ether acetate;

aliphatic ethers such as diethyl ether, dipropyl ether, dibutyl ether, butyl methyl ether, butyl ethyl ether, diisoamyl ether, hexyl methyl ether, octyl methyl ether, cyclopentyl methyl ether, and dicyclopentyl ether;

aliphatic-aromatic ethers such as anisole and phenyl ethyl ether;

cyclic ethers such as tetrahydrofuran, tetrahydropyran, and dioxane, and the like.

Examples of the hydrocarbon solvents include:

lower hydrocarbons such as hexane, cyclohexane, and heptane;

higher hydrocarbons such as decane, dodecene, and undecane, and the like.

Examples of the ketone solvents include:

dialkylketones such as acetone and methyl ethyl ketone;

cyclic ketones such as cyclopentanone and cyclohexanone, and the like.

Examples of the ester solvents include ethyl acetate, butyl acetate, and the like.

Among these, the alcohol solvents and the ether solvents are preferred; the monohydric alcohols, the aliphatic ethers, the cyclic ethers, the partial alkyl ethers of polyhydric alcohols, the alkyl ethers of polyhydric alcohols, the alkyl ether acetates of polyhydric alcohols are more preferred; a monohydric alcohol having 4 to 10 carbon atoms and an aliphatic ether having an alkyl chain having 4 to 10 carbon atoms are still more preferred; and 4-methyl-2-pentanol and diisoamyl ether are particularly preferred. It is preferred that the solvent (B) includes an ether solvent, since it leads to lowering of the viscosity of the composition for forming a liquid immersion upper layer film, effective reduction of the amount of the composition coated, consequently resulting in cost reduction.

Optional Component

The composition for forming a liquid immersion upper layer film may include, in addition to the polymer component (A) and the solvent (B), an optional component. Examples of the optional component include a surfactant, and the like.

Examples of the surfactant include commercially available fluorochemical surfactants such as BM-1000, BM-1100 (each manufactured by BM Chemie), Megafac F142D, F172, F173, and F183 (each manufactured by DIC), and the like. The content of the surfactant with respect to 100 parts by mass of the polymer component (A) is preferably no greater than 5 parts by mass.

Preparation Method of Composition for Forming a Liquid Immersion Upper Layer Film The composition for forming a liquid immersion upper layer film can be prepared, for example, by mixing the polymer component (A), and the optional component as required, with the solvent (B) to dissolve the same in the solvent (B). The solid content concentration of the composition for forming a liquid immersion upper layer film is typically 0.5% by mass to 30% by mass, and preferably 1% by mass to 20% by mass.

Forming Method of Resist Pattern

The resist pattern-forming method according to an embodiment of the present invention includes:

(1) providing a resist film using a photoresist composition;

(2) providing a liquid immersion upper layer film on the resist film using the composition for forming a liquid immersion upper layer film according to the embodiment of the present invention;

(3) exposing the resist film having the liquid immersion upper layer film provided thereon to an exposure light through a liquid immersion medium; and (4) developing the resist film.

Since the resist pattern-forming method uses the composition for forming a liquid immersion upper layer film as described above, a liquid immersion upper layer film which is excellent in peel resistance while exhibiting high water repellency can be provided.

Hereinafter, each step will be explained.

Step (1)

In the step (1), a resist film is provided by coating a photoresist composition on a substrate. A silicon wafer, a silicon wafer coated with aluminum, and the like are typically used as the substrate. In addition, in order to maximally utilize the characteristics of the resist film, it is also preferred to preform, for example, an organic or inorganic antireflective film as disclosed in, for example, Japanese Examined Patent Application, Publication No. 6-12452 and the like on the surface of the substrate.

The type of the photoresist composition is not particularly limited, and may be appropriately selected from the photoresist compositions conventionally used to provide a resist film, depending on intended use of the resist. Among these, a photoresist composition containing (P) a polymer that includes an acid-labile group and (Q) an acid generating agent is preferred. The term "acid-labile group" as used herein refers to a group that substitutes for a hydrogen atom of a carboxy group, a hydroxy group and the like and is dissociated by an action of an acid.

In the polymer (P), examples of a structural unit that includes the acid-labile group (hereinafter, may be also referred to as "structural unit (p)") include a structural unit represented by the following formula (9), and the like.

(9)

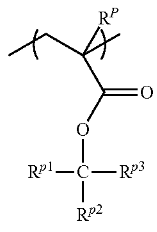

In the above formula (9), $R^P$ represents a hydrogen atom, a fluorine atom, a methyl group or a trifluoromethyl group; $R^{p1}$ represents a monovalent chain hydrocarbon group having 1 to 10 carbon atoms; and $R^{p2}$ and $R^{p3}$ each independently represent a monovalent chain hydrocarbon group having 1 to 10 carbon atoms or a monovalent alicyclic hydrocarbon group having 3 to 20 carbon atoms, or taken together represent a ring structure having 3 to 20 carbon atoms together with the carbon atom to which $R^{p2}$ and $R^{p3}$ bond.

$R^P$ represents preferably a hydrogen atom or a methyl group in view of copolymerizability of a monomer that gives the structural unit (p) and the like, and more preferably a methyl group.

Examples of the monovalent chain hydrocarbon group having 1 to 10 carbon atoms represented by $R_{p1}$, $R^{p2}$ and $R^{p3}$ include an alkyl group such as a methyl group, an ethyl group, a n-propyl group, an i-butyl group, and a n-butyl group, and the like.

Examples of the monovalent alicyclic hydrocarbon group having 3 to 20 carbon atoms which may be represented by $R^{p2}$ and $R^{p3}$ include a monocyclic cycloalkyl group such as a cyclobutyl group, a cyclopentyl group, and a cyclohexyl group; a polycyclic cycloalkyl group such as a norbornyl group and an adamantyl group, and the like.

Examples of the ring structure having 3 to 20 carbon atoms which may be taken together represented by $R^{p2}$ and $R^{p3}$ together with the carbon atom to which these groups bond include monocyclic cycloalkane structures such as a cyclopentane structure and a cyclohexane structure; polycyclic cycloalkane structures such as a norbornane structure and an adamantane structure, and the like.

Examples of the structural unit (p) include structural units derived from 1-alkyl-1-monocyclic cycloalkyl (meth)acrylates such as 1-ethyl-1-cyclopentyl (meth)acrylate, and 2-alkyl-2-polycyclic cycloalkyl (meth)acrylates such as 2-i-propyl-2-adamantyl (meth)acrylate, and the like.

It is preferred that the polymer (P) further includes, in addition to the structural unit (p), a structural unit having a lactone structure, a cyclic carbonate structure, a sultone structure or a combination thereof (hereinafter, may be also referred to as "structural unit (q)").

Examples of the structural unit (q) include structural units derived from (meth) acrylate esters having, for example:

a lactone structure such as a norbornanelactone structure and a butyrolactone structure;

a cyclic carbonate structure such as an ethylene carbonate structure and a propylene carbonate structure;

a sultone structure such as a norbornanesultone structure and a propanesultone structure, or the like.

In addition, the polymer (P) may include a structural unit other than the structural unit (p) and structural unit (q). Examples of the other structural unit include a structural unit having a hydrocarbon group having 4 to 20 carbon atoms, a structural unit that includes a polar group such as a hydroxy group, and the like.

The proportion of the structural unit (p) with respect to the entire structural units constituting the polymer (P) is preferably 30 mol % to 60 mol %. When the proportion of the structural unit (p) falls within the above range, resolution of the photoresist composition can be improved. When the proportion of the structural unit (p) is below the lower limit described above, pattern formability of the photoresist composition may be impaired. When the proportion of the structural unit (p) exceeds the upper limit, the adhesiveness of the resultant resist film to a substrate may be impaired.

The proportion of the structural unit (q) with respect to the entire structural units constituting the polymer (P) is preferably 20 mol % to 60 mol %. When the proportion of the structural unit (q) falls within the above range, solubility of the resist film provided from the photoresist composition in a developer solution can be properly adjusted, while adhesiveness of the resist film to a substrate can be improved. When the proportion of the structural unit (q) is below the lower limit described above, the adhesiveness of the photoresist composition to a substrate may be impaired. When the proportion of the structural unit (q) exceeds the upper limit, the pattern formability of the photoresist composition may be impaired.

The proportion of the other structural unit with respect to the entire structural units constituting the polymer (P) is preferably no greater than 20 mol %, and more preferably no greater than 15 mol %.

The acid generating agent (Q) is a substance which generates an acid by irradiation with (exposure to) a radioactive ray. In light-exposed sites, an acid-labile group protecting a carboxy group or the like of the polymer (P) is dissociated by an action of the acid generated, thereby regenerating the carboxy group or the like. As a result, in the light-exposed sites, solubility of the polymer (P) in the developer solution is altered, and thereby a resist pattern is formed.

Examples of the acid generating agent (Q) include onium salts such as a sulfonium salt, a tetrahydrothiophenium salt, an iodonium salt, a phosphonium salt, a diazonium salt, and a pyridinium salt; N-sulfonyloxyimide compounds; halogen-containing compounds; diazo ketone compounds, and the like.

Examples of the sulfonium salt include triphenylsulfonium nonafluoro-n-butanesulfonate, 4-cyclohexylphenyldiphenylsulfonium nonafluoro-n-butanesulfonate, triphenylsulfonium 2-(bicyclo[2.2.1]hepta-2'-yl)-1,1,2,2-tetrafluoroethanesulfonate, triphenylsulfonium 2-(bicyclo[2.2.1]hepta-2'-yl)-1,1-difluoroethanesulfonate, and the like.

Examples of the tetrahydrothiophenium salt include 1-(4-n-butoxynaphthalen-1-yl)tetrahydrothiophenium nonafluoro-n-butanesulfonate, (4-n-butoxynaphthyl)tetrahydrothiophenium 2-(bicyclo[2.2.1]hepta-2'-yl)-1,1,2,2-tetrafluoroethanesulfonate, and the like.

In addition to the polymer (P) and the acid generating agent (Q), the photoresist composition may include other component such as (R) an acid diffusion control agent, and a surfactant. Examples of the acid diffusion control agent (R) include amine compounds such as trioctylamine and triethanolamine; N-t-alkoxycarbonyl-containing amide compounds such as R-(+)-(t-butoxycarbonyl)-2-piperidine methanol and N-t-butoxycarbonyl-4-hydroxypiperidine; photodegradable bases such as triphenylsulfonium 10-camphorsulfonate and triphenylsulfonium salicylate, and the like.

The photoresist composition is prepared, for example, by dissolving the polymer (P), the acid generating agent (Q), and the acid diffusion control agent (R) and the like as required in the solvent. In addition, the photoresist composition is typically used after being filtered through a filter with a pore size of about 30 nm. The total solid content concentration of the photoresist composition is preferably 0.2% by mass to 20% by mass in view of its ease of coating.

A coating method of the photoresist composition is exemplified by conventionally well-known coating methods such as spin-coating, cast coating, roll coating, and the like. After coating the photoresist composition on the substrate, the photoresist composition may be subjected to prebaking (PB) in order to evaporate the solvent.

Step (2)

In the step (2), the composition for forming a liquid immersion upper layer film according to the embodiment of the present invention is coated on the resist film to provide a liquid immersion upper layer film. A coating method of the composition for forming a liquid immersion upper layer film is exemplified by the same methods as those of photoresist composition in the step (1). In this step, it is preferred to conduct prebaking (PB) after coating the composition for forming a liquid immersion upper layer film. By providing the liquid immersion upper layer film on the resist film in this manner, a liquid immersion liquid and the resist film do not directly contact with each other, which effectively inhibits the impairment of the lithography performance of the resist film caused by penetration of the liquid immersion liquid into the resist film, and contamination of a lens of a projection aligner caused by a component eluted from the resist film into the liquid immersion liquid.

It is preferred to bring a thickness of the resultant liquid immersion upper layer film as closer to an odd multiple of $\lambda/4$ m (in which, $\lambda$ is a wavelength of the radioactive ray; and m is a refractive index of the protective film) as possible. By setting the thickness of the liquid immersion upper layer film in this manner, the effect of inhibiting reflection on an upper interface of the resist film can be enhanced.

Step (3)

In the step (3), a liquid for immersion lithography is disposed on the liquid immersion upper layer film, and the resist film is exposed to an exposure light through this liquid for immersion lithography.

A liquid which has a higher refractive index than air is typically used as the liquid immersion medium. Water is preferably used as the liquid immersion medium, and pure water is more preferably used. Herein, the pH of the liquid immersion liquid may be adjusted as required. In the presence of this liquid immersion medium, more specifically, in a state in which a space between the lens of the aligner and the liquid immersion upper layer film is filled with the liquid immersion medium, an exposure light is irradiated from the aligner to expose the liquid immersion upper layer film and the photoresist film through a mask having a predetermined pattern.

The exposure light used in this step may be appropriately selected in accordance with the type of the photoresist film and/or the liquid immersion upper layer film, and is exemplified by a visible light ray; an ultraviolet ray such as a g-line and an i-line, a far ultraviolet ray such as an excimer laser, an X-ray such as a synchrotron radioactive ray, a charged particle ray such as an electron beam, and the like. Among these, an ArF excimer laser beam (wavelength 193 nm) and a KrF excimer laser beam (wavelength 248 nm) are preferred, and an ArF excimer laser beam is more preferred. The irradiation condition of the exposure light such as, for example, an exposure dose may be appropriately selected in accordance with the blend composition of the photoresist composition and/or the composition for forming a liquid immersion upper layer film, the type of an additive contained therein, and the like.

In order to improve resolution, pattern configuration, developability and the like of the resultant resist pattern, post exposure baking (PEB) is preferably carried out after the exposure. The PEB temperature can be appropriately selected in accordance with the type of the photoresist composition and/or the composition for forming a liquid immersion upper layer film employed, and the like, but is typically 30° C. to 200° C., and preferably 50° C. to 150° C. The PEB time is typically 5 sec to 600 sec, and preferably 10 sec to 300 sec.

Step (4)

In the step (4), the resist film exposed as described above is developed. A desired resist pattern can be thereby obtained. According to the resist pattern-forming method, since the liquid immersion upper layer film is provided from the composition for forming a liquid immersion upper layer film according to the embodiment of the present invention, the liquid immersion upper layer film can be readily removed by a developer solution during the development, or by a washing liquid during washing if the washing is carried out after the development. This means that a separate peeling step for removing the liquid immersion upper layer film is not required. In this step, the development may be carried out with either an alkali or an organic solvent. A positive resist pattern is formed in the development with an alkali, whereas a negative resist pattern is formed in the development with an organic solvent. Of these, the development with an alkali is preferred.

For the development with an alkali, the developer solution is, preferably:

an aqueous alkaline solution prepared by dissolving at least one of alkaline compounds such as sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetraalkylammonium hydroxides (for example, tetramethylammonium hydroxide (TMAH), tetraethylammonium hydroxide, and the like), pyrrole, piperidine, choline and 1,8-diazabicyclo-[5.4.0]-7-undecene, 1,5-diazabicyclo-[4.3.0]-5-nonane. Among these, an aqueous solution of the tetraalkylammonium hydroxides is preferred, and an aqueous TMAH solution is more preferred.

An appropriate amount of a water soluble organic solvent such as an alcohol such as methanol and ethanol, and a surfactant, for example, may be added to the developer solution used in the development with an alkali.

Alternatively, in the development with an organic solvent, a developer solution containing an organic solvent is used. The organic solvent is exemplified by the same solvent as those exemplified as the solvent (B) included in the composition for forming a liquid immersion upper layer film, and the like.

Among these, the ether solvents, the ketone solvents, and the ester solvents are preferred, and n-butyl acetate, isopropyl acetate, amyl acetate, anisole, 2-butanone, methyl n-butyl ketone, and methyl n-amyl ketone are more preferred. These organic solvents may be used either alone, or in combination of two or more thereof.

The content of the organic solvent in the developer solution used in the development with an organic solvent is preferably no less than 80% by mass, more preferably no less than 90% by mass, and still more preferably 100% by mass. When the content of the organic solvent in the developer solution falls within the above range, dissolution contrast between the light-exposed site and the light-unexposed site can be improved, whereby a resist pattern superior in lithography characteristics can be formed. Examples of components other than the organic solvent include water, silicone oil, and the like.

The resist film after the development is preferably washed with a rinse agent, and dried. In the development with an alkali, the rinse agent is preferably water, and more preferably ultrapure water. In the development with an organic solvent, the rinse agent is preferably an organic solvent, and more preferably an alcohol solvent.

Polymer

The polymer according to an embodiment of the present invention has the structural unit (I) represented by the above formula (1). Since the polymer has the specific structural unit, the polymer can be suitably used, for example, as the polymer component constituting the composition for forming a liquid immersion upper layer film, and the liquid immersion upper layer film provided from the composition for forming a liquid immersion upper layer film that includes the polymer is excellent in peel resistance while exhibiting high water repellency.

Compound

The compound according to an embodiment of the present invention is represented by the above formula (i). Since the compound has the specific structure described above, the compound can be suitably used, for example, as a monomer that gives a polymer component constituting the composition for forming a liquid immersion upper layer film.

EXAMPLES

Hereinafter, the embodiment of the present invention will be explained in more detail by way of Examples, but the present invention is not in any way limited by Examples. Measuring methods for various types of physical properties are shown below.

$^{1}$H-NMR Analysis, $^{13}$C-NMR Analysis and $^{19}$F-NMR Analysis $^{1}$H-NMR analysis, $^{13}$C-NMR analysis and $^{19}$F-NMR analysis were carried out using a nuclear magnetic resonance apparatus (JNM-ECX400, manufactured by JEOL, Ltd.), $CDCl_3$ as a measurement solvent, and tetramethylsilane (TMS) as an internal standard.

Measurement of Mw and Mn

Mw and Mn of the polymer were determined by gel permeation chromatography (GPC) under the following conditions:

GPC columns: G2000HXL×2, G3000HXL×1, G4000HXL×1 (manufactured by Tosoh Corporation)

elution solvent: tetrahydrofuran flow rate: 1.0 mL/min column temperature: 40° C.

standard substance: mono-disperse polystyrene detector: differential refractometer

Synthesis of Compound

Example 1

Synthesis of Compound (S-1)

To a 100 mL three-neck reactor which had been equipped with a dropping funnel and a condenser and dried, were placed 4.5 mL of ethylene glycol, 0.2 mL of triethylamine and 25 mL of toluene, and heated to 60° C. in an oil bath. Thereafter, 3.1 mL of diketene was added dropwise over 10 min. After the dropwise addition, the mixture was stirred at 80° C. for 3 hrs. Thereafter, the stirring was continued at 110° C. for 3 hrs. Next, toluene was distilled off under vacuum, and the obtained crude product was purified by column chromatography (developing solvent: ethyl acetate) to obtain 4.1 g (70% yield) of a compound represented by the following formula (T-1).

(T-1)

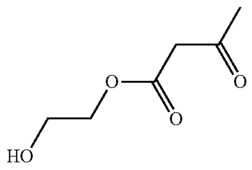

$^1$H-NMR ($CDCl_3$) δ: 2.3 (s, 3H), 3.2 (brs, 1H), 3.5 (s, 3H), 3.8 (t, 3H)

A solution was prepared by dissolving 14.6 g of the obtained compound (T-1) and 20.2 g of triethylamine in 100 mL of ethyl acetate, the solution was cooled to 0° C. in an ice bath, 19.3 g of ethyl 2-(bromomethyl)acrylate was added dropwise over 30 min, and the mixture was stirred at room temperature for 3 hrs. Thereafter, the mixture was filtered, followed by washing twice with 100 mL of 1 N hydrochloric acid, dried over anhydrous magnesium sulfate, and then concentrated under vacuum to obtain 20.0 g (78% yield) of a compound represented by the following formula (S-1).

$^1$H-NMR ($CDCl_3$) δ: 1.3 (t, 3H), 2.3 (s, 3H), 3.4 (s, 2H), 3.7 (t, 2H), 4.0 (s, 2H), 4.1 (t, 2H), 4.2 (m, 2H), 6.0 (s, 1H), 6.5 (s, 1H)

Example 2

Synthesis of Compound (S-2)

A solution was prepared by dissolving 25.8 g of the obtained compound (S-1) in 100 mL of tetrahydrofuran, and to this solution was added dropwise over 1 hr an aqueous solution obtained by dissolving 4.7 g of lithium hydroxide in 50 mL of water. Next, 1 N hydrochloric acid was added thereto so as to adjust the pH of the mixture to 5, followed by extraction twice with 100 mL of dichloromethane. The combined extracts were dried over anhydrous magnesium sulfate, and then concentrated under vacuum to obtain 20.3 g (88% yield) of a compound represented by the following formula (S-2).

$^1$H-NMR ($CDCl_3$) δ: 2.3 (s, 3H), 3.4 (s, 2H), 3.7 (t, 2H), 4.0 (s, 2H), 4.2 (t, 2H), 6.1 (s, 1H), 6.8 (s, 1H)

Example 3

A solution was prepared by dissolving 23.0 g of the obtained compound (S-2) in 100 mL of ethyl acetate, to this solution were added 33.2 g of 4-(4,6-dimethoxy-1,3,5-triazin-2-yl)-4-methylmorpholinium chloride, 12.1 g of 4-methylmorpholine, and 114.4 g of 1,1,1-trifluoro-2-trifluoromethyl-2,4-butanediol, and the mixture was stirred at room temperature for 3 hrs. Thereafter, the mixture was filtered, followed by washing twice with 100 mL of 1 N hydrochloric acid, dried over anhydrous magnesium sulfate, and then concentrated under vacuum to obtain 20.7 g (70% yield) of a compound represented by (S-3).

$^1$H-NMR ($CDCl_3$) δ: 1.7 (t, 2H), 2.3 (s, 3H), 3.4 (s, 2H), 3.7 (t, 2H), 3.8 (t, 2H), 4.0 (s, 2H), 4.2 (t, 2H), 6.0 (s, 1H), 6.5 (s, 1H)

Example 4

Synthesis of Compound (S-4)

To a 100 mL three-neck reactor which had been equipped with a dropping funnel and a condenser and dried, were placed 10.8 g of lithium acetoacetate, 13.9 mL of triethylamine and 25 mL of toluene, and to this mixture was added dropwise 19.3 g of ethyl 2-(bromomethyl)acrylate over 10 min. After the dropwise addition, the mixture was stirred at 80° C. for 3 hrs. Next, toluene was distilled off under vacuum, and the obtained crude product was purified by column chromatography (developing solvent: ethyl acetate) to obtain 15.4 g (72% yield) of a compound represented by the following formula (S-4).

$^1$H-NMR ($CDCl_3$) δ: 1.3 (t, 3H), 2.3 (s, 3H), 3.4 (s, 2H), 4.0 (s, 2H), 4.2 (m, 2H), 6.0 (s, 1H), 6.5 (s, 1H)

Example 5

Synthesis of Compound (S-5)

A solution was prepared by dissolving 23.0 g of the obtained compound (S-2) in 100 mL of ethyl acetate, to this solution were added 33.2 g of 4-(4,6-dimethoxy-1,3,5-triazin-2-yl)-4-methylmorpholinium chloride, 12.1 g of 4-methylmorpholine, and 12.0 g of 2,2,2-trifluoroethanol, and the mixture was stirred at room temperature for 3 hrs. Thereafter, the mixture was filtered, followed by washing twice with 100 mL of 1 N hydrochloric acid, dried over anhydrous magnesium sulfate, and then concentrated under vacuum to obtain 23.4 g (75% yield) of a compound represented by (S-5).

$^1$H-NMR ($CDCl_3$) δ: 2.3 (s, 3H), 3.4 (s, 2H), 3.7 (t, 2H), 4.0 (s, 2H), 4.2 (t, 2H), 4.7 (m, 2H), 6.0 (s, 1H), 6.5 (s, 1H)

Example 6

Synthesis of Compound (S-6)

A solution was prepared by dissolving 31.2 g of the obtained compound (S-5) in 100 mL of dichloromethane, to the solution was added 15.8 g of pyridine, and then 7.9 g of acetyl chloride was added dropwise over 1 hr. Thereafter, the mixture was washed twice with 100 mL of 1 N hydrochloric acid. The mixture was dried over anhydrous magnesium sulfate, and then concentrated under vacuum to obtain 23.0 g (65% yield) of a compound represented by the following formula (S-6).

$^1$H-NMR ($CDCl_3$) δ: 2.1 (s, 6H), 3.4 (s, 1H), 3.7 (t, 2H), 4.0 (s, 2H), 4.2 (t, 2H), 4.7 (m, 2H), 6.0 (s, 1H), 6.5 (s, 1H)

Example 7

Synthesis of Compound (S-7)

A solution was prepared by dissolving 15.8 g of 4-(hydroxymethyl)cyclohexyl carboxylic acid and 20.2 g of triethylamine in 100 mL of ethyl acetate, the solution was cooled to 0° C. in an ice bath, 19.3 g of ethyl 2-(bromomethyl) acrylate was added dropwise over 30 min, and the mixture was stirred at room temperature for 3 hrs. Thereafter, the mixture was filtered, followed by washing twice with 100 mL of 1 N hydrochloric acid, dried over anhydrous magnesium sulfate, and then concentrated under vacuum to obtain 23.0 g (85% yield) of a compound represented by the following formula (S-7).

$^1$H-NMR ($CDCl_3$) δ: 1.2 (t, 3H), 1.5-1.9 (m, 10H), 3.3 (d, 2H), 4.0 (s, 2H), 4.2 (m, 2H), 6.0 (s, 1H), 6.5 (s, 1H)

Example 8

Synthesis of Compound (S-8)

A solution was prepared by dissolving 9.0 g of 3-hydroxypropionic acid and 20.2 g of triethylamine in 100 mL of ethyl acetate, the solution was cooled to 0° C. in an ice bath, 19.3 g of methyl 2-(bromomethyl)acrylate was added dropwise over 30 min, and then the mixture was stirred at room temperature for 3 hrs. Thereafter, the mixture was filtered, followed by washing twice with 100 mL of 1 N hydrochloric acid, dried over anhydrous magnesium sulfate, and then concentrated under vacuum to obtain 15.6 g (77% yield) of a compound represented by the following formula (S-6).

$^1$H-NMR ($CDCl_3$) δ: 2.4 (t, 2H), 3.6 (t, 2H), 4.0 (s, 2H), 4.2 (m, 2H), 4.3 (s, 3H), 6.0 (s, 1H), 6.5 (s, 1H)

(S-1)

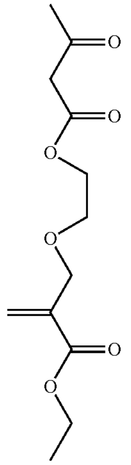

(S-2)

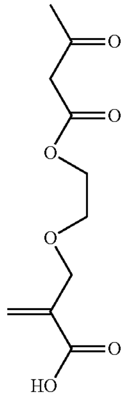

-continued (S-3)

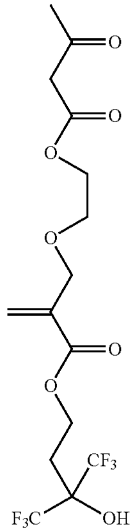

(S-4)

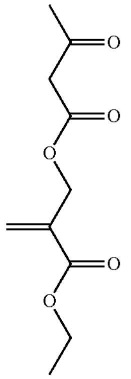

(S-5)

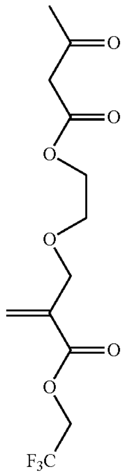

-continued
(S-6)
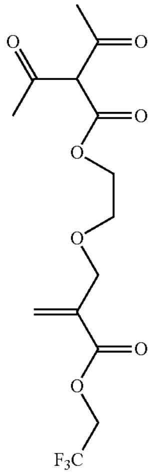
(S-7)
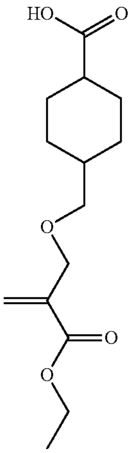
(S-8)
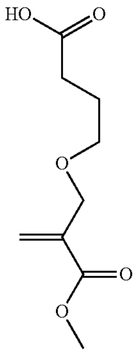
Synthesis of Polymer Component (A)
For synthesis of the polymer (a) and polymer (b) which constitute the polymer component (A), the monomers (S-1), (S-3), (S-4) and (S-6) to (S-8) synthesized as above and monomers (M-1) to (M-9) represented by the following formulae were used.
(M-1)
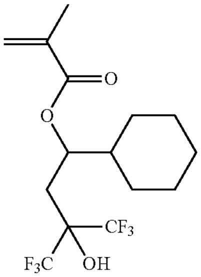
(M-2)
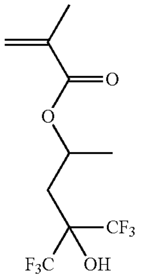
(M-3)
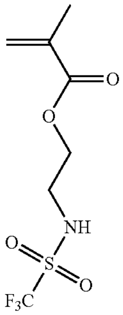
(M-4)
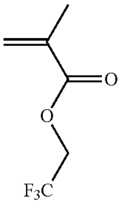
(M-5)
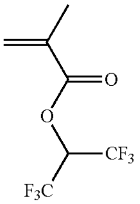
(M-6)
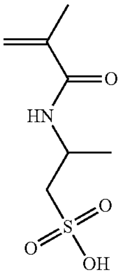

-continued (M-7)

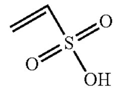

(M-8)

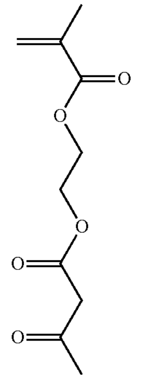

(M-9)

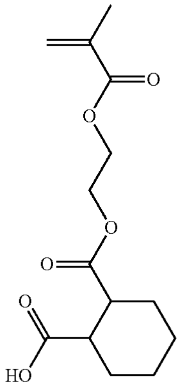

Note that the monomers (S-1), (S-3), (S-4) and (S-6) to (S-8) give the structural unit (I), the monomers (M-6) and (M-7) give the structural unit (II), the monomers (M-4) and (M-5) give the structural unit (III), the monomers (M-1) to (M-3) give the structural unit (IV), and the monomers (M-8) and (M-9) give the structural unit (V).

Synthesis of Polymer (a)

Example 9

A polymerization initiator solution was prepared by dissolving 0.4 g of dimethyl 2,2-azobis(2-methylpropionate) as a polymerization initiator in 1.0 g of methyl ethyl ketone. Separately, to a 200 mL three-neck flask equipped with a thermometer and a dropping funnel were charged, 4.2 g (50 mol %) of the monomer (S-1), 5.8 g (50 mol %) of the monomer (M-1) and 9.3 g of methyl ethyl ketone, and the content of the flask was purged with nitrogen for 30 min. After purging with nitrogen, the content of the flask was heated so as to reach 75° C. with stirring with a magnetic stirrer. Subsequently, the prepared polymerization initiator solution was added dropwise over 5 min through the dropping funnel, and the mixture was incubated for 360 min. Thereafter, the polymerization reaction solution was cooled to no greater than 30° C.

Next, methyl ethyl ketone was added to the obtained polymerization reaction solution to dilute the same to 44 g, and then the diluted solution was transferred to a separatory funnel. To this separatory funnel were charged 44 g of methanol and 220 g of n-hexane, and purification through liquid separation was carried out. After the separation, the underlayer liquid was recovered. To the recovered underlayer liquid was charged 220 g of n-hexane, and purification through liquid separation was carried out. After the separation, the underlayer liquid was recovered. The liquid phase of the recovered underlayer liquid was replaced by 4-methyl-2-pentanol to obtain a solution containing a polymer (a-1). From the mass of the residue obtained after 0.5 g of the solution containing the polymer was placed on an aluminum dish and heated on a hot plate at 155° C. for 30 min, the solid content concentration of the solution containing the polymer (a-1) was calculated, and the value of the solid content concentration was used to subsequently prepare the composition for forming a liquid immersion upper layer film and to calculate a yield. The obtained polymer (a-1) had an Mw of 8,100 and an Mw/Mn of 1.8, and the yield was 60%. In addition, the proportions of the structural units derived from (S-1) and (M-1) were 51 mol % and 49 mol %, respectively. Note that the proportion (mol %) of each structural unit in the polymer was determined by $^{1}$H-NMR, $^{13}$C-NMR and $^{19}$F-NMR analyses.

Examples 10 to 18

The polymers (a-2) to (a-10) were each synthesized in a similar manner to Example 9 except that the type and amount of the monomers used were as specified in Table 1 below. Note that the symbol "-" in Table 1 indicates that the corresponding component was not used.

Example 19

A monomer solution was prepared by dissolving 9.9 g (85 mol %) of the monomer (S-8) and 0.7 g of dimethyl 2,2-azobis(2-methylpropionate) as a polymerization initiator in 2.0 g of isopropanol. Separately, to a 200 mL three-neck flask equipped with a thermometer and a dropping funnel was charged 6 g of isopropanol, and the content of the flask was purged with nitrogen for 30 min. After purging with nitrogen, the content of the flask was heated so as to reach 80° C. with stirring with a magnetic stirrer. Then, the prepared monomer solution was added dropwise over 2 hrs through the dropping funnel. After completing the dropwise addition, the reaction was allowed to proceed for another 1 hr, and then, 2 g of an isopropanol solution containing 0.1 g (15 mol %) of the monomer (M-7) was added dropwise over 30 min. Thereafter, the reaction was allowed to proceed for another 1 hr, and then the polymerization reaction solution was cooled to no greater than 30° C.

Isopropanol was added to the obtained polymerization reaction solution to dilute the same to 44 g, and then the diluted solution was transferred to a separatory funnel. To this separatory funnel were charged 44 g of methanol and 264 g of n-hexane, and purification through liquid separation was carried out. After the separation, the underlayer liquid was recovered. The underlayer liquid was transferred again to the separatory funnel. Thereafter, 264 g of n-hexane was charged to the separatory funnel, purification through liquid separation was carried out, and after the separation, the underlayer liquid was recovered. The liquid phase of the recovered underlayer liquid was replaced by 4-methyl-2-pentanol, and the total amount of the resultant mixture was adjusted to 40 g. Next, 40 g of water was added thereto, purification through liquid separation was carried out, and after the separation, the upper layer liquid was recovered. The liquid phase of the recovered upper layer liquid was replaced by 4-methyl-2-pentanol to obtain a solution containing the polymer (a-11). The obtained polymer (a-11) had an Mw of 9,990 and an Mw/Mn of 1.9, and the yield was 72%. In addition, the proportions of the structural units derived from (S-6) and (M-7) were 98 mol % and 2 mol %, respectively.

The proportions of the structural units, yield, and values of Mw and Mw/Mn of each of the obtained polymer (a) are collectively shown in Table 1.

TABLE 1

| | | Monomer that gives structural unit (I) | | | Monomer that gives structural units (II) to (V) | | | | Physical property | |
|---|---|---|---|---|---|---|---|---|---|---|
| | | | using amount | proportion of structural unit | | using amount | proportion of structural unit | Yield | | |
| | Polymer (a) | type | (mol %) | (mol %) | type | (mol %) | (mol %) | (%) | Mw | Mw/Mn |
| Example 9 | a-1 | S-1 | 50 | 51 | M-1 | 50 | 49 | 60 | 8,100 | 1.8 |
| Example 10 | a-2 | S-1 | 50 | 51 | M-2 | 50 | 49 | 71 | 9,700 | 2.0 |
| Example 11 | a-3 | S-3 | 80 | 79 | M-3 | 20 | 21 | 72 | 7,260 | 2.0 |
| Example 12 | a-4 | S-3 | 50 | 48 | M-4 | 50 | 52 | 65 | 9,800 | 1.9 |
| Example 13 | a-5 | S-3 | 50 | 49 | M-5 | 50 | 51 | 78 | 10,030 | 2.0 |
| Example 14 | a-6 | S-3 | 100 | 100 | — | — | — | 83 | 10,000 | 2.1 |
| Example 15 | a-7 | S-3 | 60 | 61 | M-4 | 40 | 39 | 69 | 9,980 | 1.9 |
| Example 16 | a-8 | S-4 | 80 | 81 | M-5 | 20 | 19 | 77 | 9,100 | 2.1 |
| Example 17 | a-9 | S-6 | 50 | 49 | M-1 | 50 | 51 | 70 | 11,700 | 2.1 |
| Example 18 | a-10 | S-7 | 20 | 19 | M-1 | 80 | 81 | 77 | 10,040 | 2.2 |
| Example 19 | a-11 | S-8 | 85 | 98 | M-7 | 15 | 2 | 78 | 9,990 | 1.9 |

Synthesis of Polymer (b)

Synthesis Examples 1, 2 and 4 to 6

Synthesis of Polymers (b-1), (b-2) and (b-4) to (b-6)

The polymers (b-1), (b-2) and (b-4) to (b-6) were each synthesized in a similar manner to Example 19 except that the type and amount of the monomers used were as specified in Table 2 below.

Synthesis Example 3

Synthesis of Polymer (b-3)

The polymer (b-3) was synthesized in a similar manner to Example 9 except that the type and amount of the monomers used were as specified in Table 2 below.

The proportions of the structural units, yield, and values of Mw and Mw/Mn of each of the obtained polymer (b) are collectively shown in Table 2.

TABLE 2

| | | Monomer that gives structural units (II) to (V) | | | | Physical property | |
|---|---|---|---|---|---|---|---|
| | | | using amount | proportion of structural | | | |
| | Polymer (b) | type | (mol %) | unit (mol %) | yield (%) | Mw | Mw/Mn |
| Synthesis Example 1 | b-1 | M-1<br>M-7 | 85<br>15 | 98<br>2 | 78 | 9,980 | 1.70 |
| Synthesis Example 2 | b-2 | M-2<br>M-7 | 85<br>15 | 98<br>2 | 80 | 9,910 | 1.60 |
| Synthesis Example 3 | b-3 | M-2<br>M-5 | 50<br>50 | 51<br>49 | 53 | 11,000 | 1.60 |
| Synthesis Example 4 | b-4 | M-3<br>M-6 | 95<br>5 | 95<br>5 | 81 | 10,200 | 1.70 |
| Synthesis Example 5 | b-5 | M-6<br>M-9 | 5<br>95 | 5<br>95 | 78 | 5,600 | 1.80 |
| Synthesis Example 6 | b-6 | M-2<br>M-7<br>M-8 | 60<br>15<br>26 | 69<br>2<br>29 | 76 | 5,300 | 1.80 |

Preparation of Composition for Forming a Liquid Immersion Upper Layer Film

Each of the solvent (B) used in the preparation of compositions for forming a liquid immersion upper layer film is listed below.

(B) Solvent

B-1: 4-methyl-2-pentanol

B-2: diisoamyl ether

Example 18

Preparation of Composition for Forming a Liquid Immersion Upper Layer Film (J-1)

The composition for forming a liquid immersion upper layer film (J-1) was prepared by blending 50 parts by mass of (a-1) and 50 parts by mass of (b-1) as the polymer component (A), as well as 1,000 parts by mass of (B-1) and 4,000 parts by mass of (B-2) as the solvent (B).

Examples 19 to 33

Preparation of Compositions for Forming a Liquid Immersion Upper Layer Film (J-2) to (J-16)

The compositions for forming a liquid immersion upper layer film (J-2) to (J-16) were prepared in a similar manner to Example 18 except that the type and content of each component used were as specified in Table 3 below.

Preparation of Photoresist Composition

A photoresist composition for a resist film formation was prepared according to the following method.

Synthesis of Polymer (P) for Photoresist Composition

Each of the monomers used in the synthesis of the polymer (P) for the photoresist composition is listed below.

(r-1)

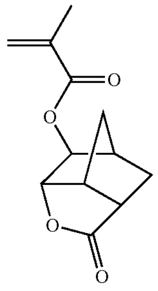

-continued (r-2)

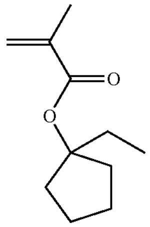

(r-3)

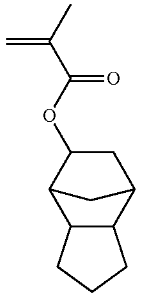

Synthesis Example 7

A monomer solution was prepared by dissolving 53.93 g (50 mol %) of the compound (r-1), 35.38 g (40 mol %) of the compound (r-2), and 10.69 g (10 mol %) of the compound (r-3) in 200 g of 2-butanone, and further dissolving 5.58 g of dimethyl 2,2'-azobis(2-methylpropionate) therein. Separately, a 500 mL three-neck flask containing 100 g of 2-butanone was purged with nitrogen for 30 min. After purging with nitrogen, the reaction vessel was heated to 80° C. with stirring, and the monomer solution prepared above was added dropwise thereto via a dropping funnel over 3 hrs. The time of the start of the dropwise addition was considered to be the time of the initiation of the polymerization reaction, and the polymerization reaction was allowed to proceed for 6 hrs. After completion of the polymerization reaction, the polymerization solution was cooled to no greater than 30° C. via water-cooling, and then poured into 2,000 g of methanol, and a deposited white powder was filtered. The filtered white powder was washed twice with 400 g of methanol by slurrying the same, filtered, and dried at 50° C. for 17 hrs to obtain the polymer (P-1) as a white powder (74 g, 74% yield). The polymer (P-1) had an Mw of 6,900 and an Mw/Mn of 1.70. In addition, the result of $^{13}C$-NMR analysis indicated that the proportion of each structural unit derived from the (r-1):(r-2):(r-3) was 53.0:37.2:9.8 (mol %).

Preparation of Photoresist Composition (α)

(Q) An acid generating agent, (R) an acid diffusion control agent and (S) a solvent used in the preparation of the photoresist composition (α) are listed below.

(Q) Acid Generating Agent

Q-1: triphenylsulfonium nonafluoro-n-butanesulfonate

Q-2: 1-(4-n-butoxynaphthalen-1-yl)tetrahydrothiophenium nonafluoro-n-butanesulfonate (R) Acid Diffusion Control Agent R-1: R-(+)-(t-butoxycarbonyl)-2-piperidine methanol (S) Solvent S-1: propylene glycol monomethyl ether acetate S-2: cyclohexanone S-3: γ-butyrolactone Synthesis Example 8

The photoresist composition (a) was prepared by mixing 100 parts by mass of (P-1) as the polymer (P), 1.5 parts by mass of (Q-1) and 6 parts by mass of (Q-2) as the acid generating agent (Q), and 0.65 parts by mass of (R-1) as the acid diffusion control agent (R), adding 2,900 parts by mass of (S-1), 1,250 parts by mass of (S-2) and 100 parts by mass of (S-3) as the solvent (S) to the mixture to adjust the total solid content concentration to 5% by mass, and filtering the mixture through a filter with a pore size of 30 nm.

Evaluation

Various types of evaluations described hereinafter were conducted for the compositions for forming a liquid immersion upper layer film obtained in the above Examples. The evaluation results are collectively shown in Table 3 below.

Composition Stability

Evaluation was made on the presence or absence of opacification over time of the compositions for forming a liquid immersion upper layer film.

After the composition for forming a liquid immersion upper layer film was stirred for 30 min, the presence or absence of opacification was visually observed. The composition stability was determined to be "A" in the case of the absence of opacification, and to be "C" in the case of the presence of opacification.

Upper Layer Film Removability

Removability of a liquid immersion upper layer film with an alkaline developer solution was evaluated.

A liquid immersion upper layer film with a film thickness of 90 nm was provided on an 8-inch silicon wafer by spin-coating a composition for forming a liquid immersion upper layer film on the 8-inch silicon wafer with a coater/developer (CLEAN TRACK ACT8, manufactured by Tokyo Electron Limited), followed by subjecting the same to prebaking (PB) at 90° C. for 60 sec. The film thickness was measured using a film thickness measurement system (Lambda Ace VM90, manufactured by DAINIPPON SCREEN MFG. CO., LTD.). The liquid immersion upper layer film was subjected to puddle development for 60 sec in the coater/developer using a 2.38% by mass aqueous TMAH solution as a developer solution, and spin-dried by spinning off the aqueous TMAH solution, and thereafter the surface of the wafer was observed. The removability of the upper layer film was determined to be "A" in the case of the observation of no residue and to be "C" in the case of the observation of any residue.

Receding Contact Angle

A receding contact angle of water on a surface of a liquid immersion upper layer film was measured.

A liquid immersion upper layer film with a film thickness of 30 nm was provided on an 8-inch silicon wafer by spin-coating a composition for forming a liquid immersion upper layer film on the 8-inch silicon wafer, followed by subjecting the same to PB on a hot plate at 90° C. for 60 sec. Thereafter, a receding contact angle was measured quickly with a contact angle meter (DSA-10, manufactured by KRUS) in an environment of room temperature (23° C.), a humidity of 45%, and an ordinary pressure in accordance with the following procedure.

First, the position of a wafer stage of the contact angle meter was adjusted, and the wafer was placed on the adjusted stage. Next, water was injected into a needle, and the position of the needle was fine-tuned to an initial position which allowed a water droplet to be formed on the wafer placed as above. Thereafter, water was discharged from the needle to form a 25 μL, water droplet on the wafer, the needle was once retracted from the water droplet, and the needle was lowered to the initial position so as to position a tip of the needle in the water droplet. Then, the water droplet was aspirated for 90 sec with the needle at a rate of 10 μL/min, during which a contact angle was concurrently measured once per second, 90 times in total. Of the measurement values, contact angle measurements acquired for 20 sec after the time point when the measurement of the contact angle became stable were averaged to obtain a reading of the receding contact angle (unit: degree (°)). The measurements of the receding contact angle are shown in Table 3 below.

Elution Inhibitory Property

An inhibitory property of the elution of a resist film component from a resist film having the liquid immersion upper layer film provided thereon was evaluated.

A silicone rubber sheet (manufactured by Kureha Elastomer Co., Ltd; a square sheet having a side length of 30 cm, with a thickness of 1.0 mm) with its central part being hollowed out in a circular shape with a diameter of 11.3 cm was mounted on the central part of an 8-inch silicon wafer that had been subjected to a treatment with hexamethyldisilazane (HMDS) at 100° C. for 60 sec in the coater/developer. Next, the hollowed central part of the silicone rubber was filled with 10 mL of ultrapure water using a 10 mL whole pipette.

Separately form the silicon wafer, an 8-inch silicon wafer having an underlayer antireflective film, a resist film and a liquid immersion upper layer film provided was prepared, and this 8-inch silicon wafer was mounted on the silicone rubber such that the liquid immersion upper layer film was positioned on the silicone rubber sheet side, in other words, so as to bring the liquid immersion upper layer film to be in contact with the ultrapure water while keeping the ultrapure water from running out.

Note that the silicon wafer having an underlayer antireflective film, a resist film and a liquid immersion upper layer film provided was obtained by: spin-coating an underlayer antireflective film forming composition (ARC29A, manufactured by Brewer Science) on the 8-inch silicon wafer with the coater/developer to provide an underlayer antireflective film with a film thickness of 77 nm; then spin-coating the photoresist composition (α) on the underlayer antireflective film with the coater/developer and subjecting the same to baking at 115° C. for 60 sec to provide a resist film with a film thickness of 205 nm; and thereafter coating a composition for forming a liquid immersion upper layer film on the resist film and subjecting the same to PB at 90° C. for 60 sec to provide a liquid immersion upper layer film with a film thickness of 30 nm.

After the liquid immersion upper layer film was mounted, the state was maintained for 10 sec. Thereafter, the mounted 8-inch silicon wafer was removed and the ultrapure water was recovered with a glass syringe, and the recovered ultrapure water was designated as a sample for analysis. The recovery rate of the ultrapure water after completion of the experiment was no less than 95%.

Next, peak intensity of the anion moiety of the acid generating agent (Q) in the ultrapure water obtained as above was measured using a liquid chromatograph-mass spectrometer (LC-MS) (LC part: SERIES 1100 (manufactured by AGILENT), and MS part: Mariner (manufactured by Perseptive Biosystems, Inc.)) under the following measurement conditions. In the measurement, peak intensity of 1 ppb, 10 ppb, and 100 ppb aqueous solutions of the acid generating agent (Q) used in the photoresist composition (α) was measured under the following measurement condition to generate a calibration curve, and the amount of the eluted acid generating agent (Q) was calculated from the peak intensity using the calibration curve. The amount of the eluted acid diffusion control agent (R) was also measured in a similar manner. The ability to inhibit the elution of the resist composition was determined to be "A" in the case of the amount of these eluted components being no greater than $5.0\times10^{-12}$ mol/cm$^2$, and to be "C" in the case of the amount of these eluted components being greater than $5.0\times10^{-12}$ mol/cm$^2$.

Measurement Conditions column employed: CAPCELL PAK MG (manufactured by Shiseido Company, Limited)×1 flow rate: 0.2 mL/min elution solvent: water/methanol (3/7) with 0.1% by mass of formic acid measurement temperature: 35° C.

Peel Resistance

Evaluation was made on difficulty of peeling of a liquid immersion upper layer film from a substrate.

An 8-inch silicon wafer that had not been subjected to a treatment with HMDS was used as a substrate. A liquid immersion upper layer film with a film thickness of 30 nm was provided on the substrate by spin-coating a liquid immersion upper layer film forming composition on the substrate with the coater/developer, followed by subjecting the same to PB at 90° C. for 60 sec. Thereafter, the liquid immersion upper layer film was subjected to rinsing with pure water for 60 sec in the coater/developer, and dried by spinning off the pure water. Peel resistance was visually determined: to be "C" if peeling of the liquid immersion upper layer film was observed on the entire surface of the wafer after rinsing; to be "A" if peeling was observed only in an edge portion; and to be "AA" if no peeling was observed.

Rectangularity of Cross-Sectional Shape

Rectangularity of a cross-sectional shape of a resist pattern formed from a resist film having a liquid immersion upper layer film provided thereon was evaluated.

An underlayer antireflective film with a film thickness of 77 nm was provided on an 8-inch silicon wafer substrate by coating an underlayer antireflective film forming composition (ARC29A, manufactured by Brewer Science) on the 8-inch silicon wafer substrate with the coater/developer. A resist film with a film thickness of 205 nm was provided on the underlayer antireflective film by spin-coating the photoresist composition (α) on the underlayer antireflective film, followed by subjecting the same to PB at 115° C. for 60 sec, and then a liquid immersion upper layer film with a film thickness of 30 nm was provided on the resist film by coating a composition for forming a liquid immersion upper layer film on the resist film, followed by subjecting the same to PB at 90° C. for 60 sec.

Next, the resist film having the liquid immersion upper layer film provided thereon was exposed using an ArF excimer laser Immersion Scanner (S610C, manufactured by NIKON) through a mask pattern for forming a line-and-space pattern (1L/1S) having a line width of 90 nm. Next, the resist film was subjected to PEB at 115° C. for 60 sec, developed with a 2.38% by mass aqueous TMAH solution as a developer solution at 23° C. for 60 sec, washed with water, and dried to form a positive resist pattern. In this process, an exposure dose resulting in formation of a line-and-space pattern (1L/1S) having a line width of 90 nm was designated as optimum exposure dose.

The cross-sectional shape of the resist pattern formed at the optimum exposure dose was observed with a scanning electron microscope (S-4800, manufactured by Hitachi High-Technologies Corporation). The rectangularity of the cross-sectional shape was determined to be "A" in the case of the cross-sectional shape of the resist pattern being rectangular, and to be "C" in the case of the cross-sectional shape of the resist pattern being a non-rectangular shape such as a T-top shape, a top round shape, and a skirt shape.

Blob Defect Inhibitory Property

An inhibitory property of the generation of a blob defect in a resist pattern obtained after development of a resist film having a liquid immersion upper layer film provided thereon was evaluated.

An 8-inch silicon wafer was prepared which had undergone hexamethyldisilazane (HMDS) treatment at 100° C. for 60 sec using a coater/developer (CLEAN TRACK ACT12, manufactured by Tokyo Electron Limited). A resist film with a film thickness of 120 nm was provided on the 8-inch silicon wafer by spin-coating the photoresist composition (α) on the 8-inch silicon wafer, followed by subjecting the same to PB on a hot plate at 90° C. for 60 sec. A liquid immersion upper layer film with a film thickness of 30 nm was provided on the resist film by spin-coating a composition for forming a liquid immersion upper layer film on the resist film, followed by subjecting the same to PB at 90° C. for 60 sec. Thereafter, the resist film was exposed through a frosted glass having no pattern. The 8-inch silicon wafer thus obtained was used for the evaluation of the blob defect.

In the evaluation of the blob defect, ultrapure water was first discharged from a rinsing nozzle of the coater/developer "CLEAN TRACK ACT8" onto the liquid immersion upper layer film of the 8-inch silicon wafer to be evaluated for 60 sec, and the liquid immersion upper layer film was spin-dried by spinning off the ultrapure water at 4,000 rpm for 15 sec. Next, puddle development was carried out for 30 sec with an LD nozzle of the "CLEAN TRACK ACT8" to remove the liquid immersion upper layer film. In the puddle development, a 2.38% by mass aqueous TMAH solution was used as a developer solution. After the development, the number of the blob defects was measured using a defect inspection apparatus (KLA2351, manufactured by KLA Tencor). The blob defect inhibitory property was determined to be "A" in the case of the number of the detected blob defects being no greater than 200 per wafer, to be "B" in the case of the number of the detected blob defects being greater than 200 and no greater than 500 per wafer, and to be "C" in the case of the number of the detected blob defects being greater than 500.

Bridge Defect Inhibitory Property

An inhibitory property of the generation of a bridge defect in a resist pattern obtained after development of a resist film having a liquid immersion upper layer film provided thereon was evaluated.

An underlayer antireflective film with a film thickness of 105 nm was provided on a 12-inch silicon wafer surface by spin-coating an underlayer antireflective film forming composition (ARC66, manufactured by Nissan Chemical Industries, Ltd.) on the 12-inch silicon wafer surface with a coater/developer (Lithius Pro-i, manufactured by Tokyo Electron Limited), followed by subjecting the same to PB. Next, a resist film with a film thickness of 100 nm was provided by spin-coating the photoresist composition (α) with the "CLEAN TRACK ACT12", subjecting the same to PB at 100° C. for 60 sec, and cooling it at 23° C. for 30 sec. Thereafter, a liquid immersion upper layer film with a film thickness of 30 nm was provided on the resist film by spin-coating a composition for forming a liquid immersion upper layer film on the resist film, followed by subjecting the same to PB at 90° C. for 60 sec.

Next, the resist film was exposed through a mask for forming a pattern with a 45 nm line/90 nm pitch, using an ArF Immersion Scanner (S610C, manufactured by NIKON) under the optical conditions involving NA of 1.30 and Crosspole. Next, the resist film was subjected to PEB on a hot plate of the aforementioned "Lithius Pro-i" at 100° C. for 60 sec, cooled at 23° C. for 30 sec, subjected to puddle development for 10 sec with a 2.38% by mass aqueous TMAH solution as a developer solution in a GP nozzle of the development cup, and rinsed with ultrapure water. Thereafter, the resist film was spin-dried by spinning off the ultrapure water at 2,000 rpm for 15 sec to obtain a substrate having the resist pattern formed thereon. In this process, an exposure dose resulting in formation of the resist pattern with a 45 nm line/90 nm pitch was designated as optimum exposure dose. The bridge defect inhibitory property was determined to be "A" if no bridge defect was observed in the resist pattern formed at the optimum exposure dose, and to be "C" if any bridge defect was observed.

TABLE 3

| | Composition for forming a liquid immersion upper layer film | (A) Polymer component | | | | (B) Solvent | |
|---|---|---|---|---|---|---|---|
| | | polymer (a) | | polymer (b) | | | |
| | | type | content (parts by mass) | type | content (parts by mass) | type | content (parts by mass) |
| Example 18 | J-1 | a-1 | 40 | b-1 | 60 | B-1/B-2 | 1,000/4,000 |
| Example 19 | J-2 | a-1 | 50 | b-2 | 50 | B-1/B-2 | 1,000/4,000 |
| Example 20 | J-3 | a-1 | 70 | b-3 | 30 | B-1/B-2 | 1,000/4,000 |
| Example 21 | J-4 | a-1 | 55 | b-4 | 45 | B-1/B-2 | 1,000/4,000 |
| Example 22 | J-5 | a-1 | 50 | b-1/b-5 | 40/10 | B-1/B-2 | 4,000/1,000 |
| Example 23 | J-6 | a-1 | 50 | b-1/b-6 | 40/10 | B-1/B-2 | 4,000/1,000 |
| Example 24 | J-7 | a-2 | 30 | b-1 | 70 | B-1/B-2 | 1,000/4,000 |
| Example 25 | J-8 | a-3 | 70 | b-1 | 30 | B-1/B-2 | 1,000/4,000 |
| Example 26 | J-9 | a-4 | 20 | b-1 | 80 | B-1/B-2 | 1,000/4,000 |
| Example 27 | J-10 | a-5 | 10 | b-1 | 90 | B-1/B-2 | 1,000/4,000 |
| Example 28 | J-11 | a-6 | 80 | b-3 | 20 | B-1/B-2 | 1,000/4,000 |
| Example 29 | J-12 | a-7 | 30 | b-1 | 70 | B-1/B-2 | 1,000/4,000 |
| Example 30 | J-13 | a-8 | 15 | b-1 | 85 | B-1/B-2 | 1,000/4,000 |
| Example 31 | J-14 | a-9 | 50 | b-1 | 50 | B-1/B-2 | 1,000/4,000 |

TABLE 3-continued

| | | | | | | | |
|---|---|---|---|---|---|---|---|
| Example 32 | J-15 | a-10 | 30 | b-1 | 70 | B-1/B-2 | 1,000/4,000 |
| Example 33 | J-16 | a-11 | 20 | b-1 | 80 | B-1/B-2 | 1,000/4,000 |

| | Evaluation result | | | | | | | |
|---|---|---|---|---|---|---|---|---|
| | composition stability | upper layer film removability | receding contact angle (°) | elution inhibitory property | peel resistance | rectangularity of cross-sectional shape | blob defect inhibitory property | bridge defect inhibitory property |
| Example 18 | A | A | 74 | A | AA | A | A | A |
| Example 19 | A | A | 72 | A | AA | A | A | A |
| Example 20 | A | A | 78 | A | AA | A | A | A |
| Example 21 | A | A | 72 | A | AA | A | A | A |
| Example 22 | A | A | 75 | A | AA | A | A | A |
| Example 23 | A | A | 75 | A | AA | A | A | A |
| Example 24 | A | A | 73 | A | AA | A | A | A |
| Example 25 | A | A | 74 | A | AA | A | A | A |
| Example 26 | A | A | 77 | A | AA | A | A | A |
| Example 27 | A | A | 79 | A | AA | A | A | A |
| Example 28 | A | A | 72 | A | AA | A | A | A |
| Example 29 | A | A | 76 | A | AA | A | A | A |
| Example 30 | A | A | 77 | A | AA | A | A | A |
| Example 31 | A | A | 76 | A | AA | A | A | A |
| Example 32 | A | A | 77 | A | AA | A | A | A |
| Example 33 | A | A | 74 | A | AA | A | A | A |

It has been found from the results shown in Table 3 that the liquid immersion upper layer film provided from the composition for forming a liquid immersion upper layer film according to the embodiment of the present invention is excellent in peel resistance while exhibiting superior performance such as superior elution inhibitory property and a high receding contact angle by virtue of high water repellency of the composition for forming a liquid immersion upper layer film.

According to the composition for forming a liquid immersion upper layer film and the resist pattern-forming method of the embodiments of the present invention, a liquid immersion upper layer film which is excellent in peel resistance while exhibiting high water repellency can be provided. The polymer according to another embodiment of the present invention can be suitably used as a polymer component of the composition for forming a liquid immersion upper layer film. The compound according to other embodiment of the present invention can be used as a monomer which gives the polymer component. Therefore, these can be suitably used in a liquid immersion lithography process allowing the formation of a finer pattern.

Obviously, numerous modifications and variations of the present invention are possible in light of the above teachings. It is therefore to be understood that within the scope of the appended claims, the invention may be practiced otherwise than as specifically described herein.

What is claimed is:

1. A composition for forming a liquid immersion upper layer film, comprising:

a polymer component comprising:

a first polymer comprising a first structural unit represented by formula (1); and a second polymer comprising a second structural unit that comprises a fluorinated alkyl group or a fluorinated cycloalkyl group, the second polymer being identical to or different from the first polymer; and a solvent, (1)

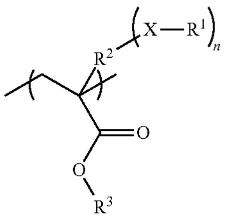

wherein, in the formula (1), $R^1$ represents a carboxy group or a group represented by formula (2);

X represents a single bond, a divalent hydrocarbon group having 1 to 20 carbon atoms or a divalent fluorinated hydrocarbon group having 1 to 20 carbon atoms;

$R^2$ represents a hydrocarbon group having 1 to 20 carbon atoms and having a valency of (n+1), a fluorinated hydrocarbon group having 1 to 20 carbon atoms and having a valency of (n+1), a hydrocarbon group having 1 to 20 carbon atoms and having a valency of (n+1) that includes between adjacent two carbon atoms thereof —CO—, —COO—, —O—, —NR'—, —CS—, —S—, —SO—, $—SO_2—$ or a combination thereof, or a fluorinated hydrocarbon group having 1 to 20 carbon atoms and having a valency of (n+1) that includes between adjacent two carbon atoms thereof —CO—, —COO—, —O—, —NR'—, —CS—, —S—, —SO—, $—SO_2—$ or a combination thereof; R' represents a monovalent hydrocarbon group having 1 to 10 carbon atoms; n is an integer of 1 to 4; and $R^3$ represents a hydrogen atom or a monovalent organic group having 1 to 20 carbon atoms, (2)

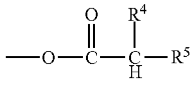

wherein, in the formula (2), $R^4$ represents a hydrogen atom, a halogen atom, a nitro group, an alkyl group, a monovalent alicyclic hydrocarbon group, an alkoxy group, an acyl group, an aralkyl group or an aryl group, wherein a part or all of hydrogen atoms included in the alkyl group, the alicyclic hydrocarbon group, the alkoxy group, the acyl group, the aralkyl group and the aryl group represented by $R^4$ are not substituted or substituted;

$R^5$ represents —C(═O) —$R^6$, —S(═O)$_2$—$R^7$, —$R^8$—CN or —$R^9$—$NO_2$;

$R^6$ represents a hydrogen atom, an alkyl group, a fluorinated alkyl group, a monovalent alicyclic hydrocarbon group, an alkoxy group, a cyano group, a cyanomethyl group, an aralkyl group or an aryl group, or $R^4$ and $R^6$ taken together represent a ring structure;

$R^7$ represents a hydrogen atom, an alkyl group, a fluorinated alkyl group, a monovalent alicyclic hydrocarbon group, an alkoxy group, a cyano group, a cyanomethyl group, an aralkyl group or an aryl group, or $R^4$ and $R^7$ taken together represent a ring structure; and $R^8$ and $R^9$ each independently represent a single bond, a methylene group or an alkylene group having 2 to 5 carbon atoms.

2. The composition according to claim 1, wherein the polymer component further comprises a third structural unit that comprises a sulfo group, the third structural unit being included in a third polymer which is identical to or different from the first polymer and which is identical to or different from the second polymer.

3. The composition according to claim 2, wherein the polymer component further comprises a fourth structural unit which comprises a group represented by formula (5), a group represented by formula (6) or a combination thereof, the fourth structural unit being included in a fourth polymer which is identical to or different from the first polymer, which is identical to or different from the second polymer, and which is identical to or different from the third polymer, (5)

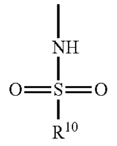

(6)

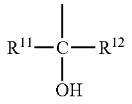

wherein, in the formula (5), $R^{10}$ represents a monovalent fluorinated hydrocarbon group having 1 to 20 carbon atoms; and in the formula (6), $R^{11}$ represents a monovalent fluorinated hydrocarbon group having 1 to 20 carbon atoms; and $R^{12}$ represents a hydrogen atom or a monovalent organic group having 1 to 20 carbon atoms.

4. The composition according to claim 1, wherein the polymer component further comprises a fourth structural unit which comprises a group represented by formula (5), a group represented by formula (6) or a combination thereof, the fourth structural unit being included in a fourth polymer which is identical to or different from the first polymer and which is identical to or different from the second polymer, (5)

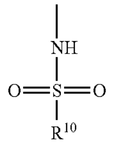

(6)

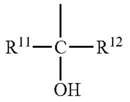

wherein, in the formula (5), $R^{10}$ represents a monovalent fluorinated hydrocarbon group having 1 to 20 carbon atoms; and in the formula (6), $R^{11}$ represents a monovalent fluorinated hydrocarbon group having 1 to 20 carbon atoms; and $R^{12}$ represents a hydrogen atom or a monovalent organic group having 1 to 20 carbon atoms.

5. The composition for forming a liquid immersion upper layer film according to claim 1, wherein the solvent comprises an ether solvent.

6. A resist pattern-forming method comprising:

providing a resist film using a photoresist composition;

providing a liquid immersion upper layer film on the resist film using an upper layer film composition;

exposing the resist film having the liquid immersion upper layer film provided thereon to an exposure light through a liquid immersion medium; and developing the resist film wherein the upper layer film composition comprises:

a polymer component comprising a first polymer which comprises a first structural unit represented by formula (1); and a solvent, (1)

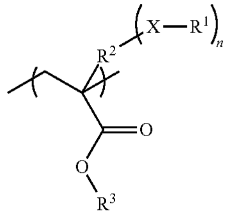

wherein, in the formula (1), $R^1$ represents a carboxy group or a group represented by formula (2);

X represents a single bond, a divalent hydrocarbon group having 1 to 20 carbon atoms or a divalent fluorinated hydrocarbon group having 1 to 20 carbon atoms;

$R^2$ represents a hydrocarbon group having 1 to 20 carbon atoms and having a valency of (n+1), a fluorinated hydrocarbon group having 1 to 20 carbon atoms and having a valency of (n+1), a hydrocarbon group having 1 to 20 carbon atoms and having a valency of (n+1) that includes between adjacent two carbon atoms thereof —CO—, —COO—, —O—, —NR'—, —CS—, —S—, —SO—, —$SO_2$— or a combination thereof, or a fluorinated hydrocarbon group having 1 to 20 carbon atoms and having a valency of (n+1) that includes between adjacent two carbon atoms thereof —CO—, —COO—, —O—, —NR'—, —CS—, —S—, —SO—, —$SO_2$— or a combination thereof; R' represents a monovalent hydrocarbon group having 1 to 10 carbon atoms; n is an integer of 1 to 4; and $R^3$ represents a hydrogen atom or a monovalent organic group having 1 to 20 carbon atoms (2)

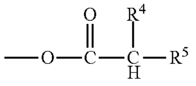

wherein, in the formula (2), $R^4$ represents a hydrogen atom, a halogen atom, a nitro group, an alkyl group, a monovalent alicyclic hydrocarbon group, an alkoxy group, an acyl group, an aralkyl group or an aryl group, wherein a part or all of hydrogen atoms included in the alkyl group, the alicyclic hydrocarbon group, the alkoxy group, the acyl group, the aralkyl group and the aryl group represented by $R^4$ are not substituted or substituted;

$R^5$ represents —C(═O) —$R^6$, —S(═O)$_2$—$R^7$, —$R^8$—CN or —$R^9$—$NO_2$;

$R^6$ represents a hydrogen atom, an alkyl group, a fluorinated alkyl group, a monovalent alicyclic hydrocarbon group, an alkoxy group, a cyano group, a cyanomethyl group, an aralkyl group or an aryl group, or $R^4$ and $R^6$ taken together represent a ring structure;

$R^7$ represents a hydrogen atom, an alkyl group, a fluorinated alkyl group, a monovalent alicclic h drocarbon group, an alkoxy group,a cyano group, a cyanomethyl group, an aralkyl group or an aryl group, or $R^4$ and $R^7$ taken together represent a ring structure; and $R^8$ and $R^9$ each independently represent a single bond, a methylene group or an alkylene group having 2 to 5 carbon atoms.

7. The resist pattern-forming method according to claim 6, wherein the polymer component further comprises a second structural unit that comprises a fluorinated alkyl group or a fluorinated cycloalkyl group, the second structural unit being included in a second polymer which is identical to or different from the first polymer.

8. The resist pattern-forming method according to claim 6, wherein the polymer component further comprises a third structural unit that comprises a sulfo group, the third structural unit being included in a third polymer which is identical to or different from the first polymer.

9. The resist pattern-forming method according to claim 6, wherein the polymer component further comprises a fourth structural unit which comprises a group represented by formula (5), a group represented by formula (6) or a combination thereof, the fourth structural unit being included in a fourth polymer which is identical to or different from the first polymer, (5)

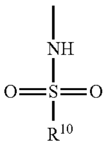

-continued (6)

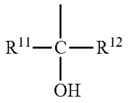

wherein, in the formula (5), $R^{10}$ represents a monovalent fluorinated hydrocarbon group having 1 to 20 carbon atoms; and in the formula (6), $R^{11}$ represents a monovalent fluorinated hydrocarbon group having 1 to 20 carbon atoms; and $R^{12}$ represents a hydrogen atom or a monovalent organic group having 1 to 20 carbon atoms.

10. A polymer comprising:

a first structural unit represented by formula (1); and a second structural unit that comprises a fluorinated alkyl group or a fluorinated cycloalkyl group:

(i)

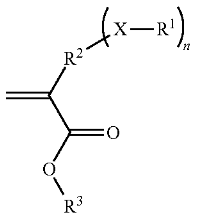

wherein, in the formula (1), $R^1$ represents a carboxy group or a group represented by formula (2);

X represents a single bond, a divalent hydrocarbon group having 1 to 20 carbon atoms or a divalent fluorinated hydrocarbon group having 1 to 20 carbon atoms;

$R^2$ represents a hydrocarbon group having 1 to 20 carbon atoms and having a valency of (n+1), a fluorinated hydrocarbon group having 1 to 20 carbon atoms and having a valency of (n+1), a hydrocarbon group having 1 to 20 carbon atoms and having a valency of (n+1) that includes between adjacent two carbon atoms thereof —CO—, —COO—, —O—, —NR'—, —CS—, —S—, —SO—, —$SO_2$— or a combination thereof, or a fluorinated hydrocarbon group having 1 to 20 carbon atoms and having a valency of (n+1) that includes between adjacent two carbon atoms thereof —CO—, —COO—, —O—, —NR'—, —CS—, —S—, —SO—, —$SO_2$—or a combination thereof; R' represents a monovalent hydrocarbon group having 1 to 10 carbon atoms; and n is an integer of 1 to 4; and $R^3$ represents a hydrogen atom or a monovalent organic group having 1 to 20 carbon atoms, (2)

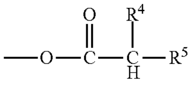

wherein, in the formula (2), $R^4$ represents a hydrogen atom, a halogen atom, a nitro group, an alkyl group, a monovalent alicyclic hydrocarbon group, an alkoxy group, an acyl group, an aralkyl group or an aryl group, wherein a part or all of hydrogen atoms included in the alkyl group, the alicyclic hydrocarbon group, the alkoxy group, the acyl group, the aralkyl group and the aryl group represented by $R^4$ are not substituted or substituted;

$R^5$ represents —C(=O) —$R^6$, —S(=O)$_2$—$R^7$, —$R^8$—CN or —$R^9$—$NO_2$;

$R^6$ represents a hydrogen atom, an alkyl group, a fluorinated alkyl group, a monovalent alicyclic hydrocarbon group, an alkoxy group, a cyano group, a cyanomethyl group, an aralkyl group or an aryl group, or $R^4$ and $R^6$ taken together represent a ring structure;

$R^7$ represents a hydrogen atom, an alkyl group, a fluorinated alkyl group, a monovalent alicyclic hydrocarbon group, an alkoxy group, a cyano group, a cyanomethyl group, an aralkyl group or an aryl group, or $R^4$ and $R^7$ taken together represent a ring structure; and $R^8$ and $R^9$ each independently represent a single bond, a methylene group or an alkylene group having 2 to 5 carbon atoms.

* * * * *

UNITED STATES PATENT AND TRADEMARK OFFICE

CERTIFICATE OF CORRECTION

PATENT NO. : 9,046,775 B2
APPLICATION NO. : 14/032528
DATED : June 2, 2015
INVENTOR(S) : Shinya Minegishi et al.

It is certified that error appears in the above-identified patent and that said Letters Patent is hereby corrected as shown below:

IN THE CLAIMS

Column 71, Line 5, “having 1 to 20 carbon atoms” should read -- having 1 to 20 carbon atoms, --

Column 71, Lines 32-33, “a monovalent alicclic h drocarbon group,” should read -- a monovalent alicyclic hydrocarbon group, --

Signed and Sealed this
Twenty-fourth Day of November, 2015

Michelle K. Lee
*Director of the United States Patent and Trademark Office*